United States Patent
Eto et al.

(10) Patent No.: US 11,069,561 B2
(45) Date of Patent: Jul. 20, 2021

(54) METHODS OF FORMING ELECTRONIC DEVICES, AND RELATED ELECTRONIC DEVICES AND ELECTRONIC SYSTEMS

(71) Applicant: Micron Technology, Inc., Boise, ID (US)

(72) Inventors: Toyonori Eto, Tokyo (JP); Kuo-Chen Wang, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 238 days.

(21) Appl. No.: 16/409,176

(22) Filed: May 10, 2019

(65) Prior Publication Data
US 2020/0357680 A1 Nov. 12, 2020

(51) Int. Cl.
*H01L 23/48* (2006.01)
*H01L 21/768* (2006.01)
*H01L 23/522* (2006.01)

(52) U.S. Cl.
CPC .... *H01L 21/7682* (2013.01); *H01L 21/76831* (2013.01); *H01L 21/76841* (2013.01); *H01L 23/5222* (2013.01)

(58) Field of Classification Search
CPC ............. H01L 21/764; H01L 21/76814; H01L 21/7682; H01L 21/76831; H01L 21/76841; H01L 21/7685; H01L 23/5226
USPC ......................................................... 257/758
See application file for complete search history.

(56) References Cited

U.S. PATENT DOCUMENTS

| | | |
|---|---|---|
| 5,451,551 A | 9/1995 | Krishnan et al. |
| 5,949,143 A | 9/1999 | Bang |
| 6,066,559 A | 5/2000 | Gonzalez |
| 6,208,015 B1 | 3/2001 | Bandyopadhyay et al. |
| 6,211,561 B1 | 4/2001 | Zhao |
| 6,551,935 B1 | 4/2003 | Sinha et al. |
| 6,917,109 B2 | 7/2005 | Lur et al. |
| 9,679,852 B2 | 6/2017 | Dutta et al. |
| 2004/0175896 A1 | 9/2004 | Chan et al. |

(Continued)

OTHER PUBLICATIONS

Xu et al., A Breakthrough in Low-k Barrier/Etch Stop Films for Copper Damascene Applications, Semiconductor Fabtech, 11th Edition, (Mar. 2000), pp. 239-244.

(Continued)

*Primary Examiner* — Brook Kebede
(74) *Attorney, Agent, or Firm* — TraskBritt

(57) ABSTRACT

An electronic device comprises a dielectric structure, interconnect structures extending into the dielectric structure and having uppermost vertical boundaries above uppermost vertical boundaries of the dielectric structure, an additional barrier material covering surfaces of the interconnect structures above the uppermost vertical boundaries of the dielectric structure, an isolation material overlying the additional barrier material, and at least one air gap laterally intervening between at least two of the interconnect structures laterally-neighboring one another. Each of the interconnect structures comprises a conductive material, and a barrier material intervening between the conductive material and the dielectric structure. The at least one air gap vertically extends from a lower portion of the isolation material, through the additional barrier material, and into the dielectric structure. Electronic systems and method of forming an electronic device are also described.

29 Claims, 11 Drawing Sheets

(56) References Cited

U.S. PATENT DOCUMENTS

2009/0243108 A1 10/2009 Gosset et al.
2016/0005693 A1 1/2016 Dutta et al.

OTHER PUBLICATIONS

Saraswat, Prof. Krishna, Interconnect Scaling, Course EE 311, Stanford University, (1999), 28 pages.
Noguchi et al., Process and Reliability of Air-Gap Cu Interconnect Using 90-nm Node Technology, IEEE Transactions on Electron Devices, vol. 52, No. 3, (Mar. 2005), pp. 352-359.
Martin et al., Integration of SiCN as a low /spl kappa/ etch stop and Cu passivation in a high performance Cu/low /spl kappa/ interconnect, Proceedings of the IEEE 2002 International Interconnect Technology Conference (Cat. No. 02EX519), (Jun. 5, 2002), 3 pages.

METHODS OF FORMING ELECTRONIC DEVICES, AND RELATED ELECTRONIC DEVICES AND ELECTRONIC SYSTEMS

TECHNICAL FIELD

Embodiments of the disclosure relate to the field of electronic device design and fabrication. More specifically, embodiments of the disclosure relate to methods of forming electronic devices including air gaps between neighboring conductive structures, and to related electronic devices and electronic systems.

BACKGROUND

Electronic device (e.g., semiconductor device, memory device) designers desire continually to increase the level of integration or density of features within an electronic device by reducing the dimensions (e.g., critical dimensions) of the individual features and by reducing the separation distance between neighboring features. As the dimensions of and spacing between conductive features (e.g., conductive structures, such as interconnect structures) decrease, resistance capacitance (RC) delay (e.g., propagation delay of a signal caused by resistance in conductive structures and the capacitance between conductive features), cross-talk (e.g., signal interference between conductive features), and power dissipation (e.g., dynamic power drained by undesirable capacitance charge and discharge in a circuit) can negatively impact desirable electronic device performance.

RC delay, cross-talk, and power dissipation are each influenced by capacitive coupling, between neighboring (e.g., laterally-neighboring) conductive features. Coupling capacitance between neighboring conductive features is influenced by a variety of factors, including the material(s) used to separate the neighboring conductive features. Materials having relatively higher dielectric constants increase capacitive coupling between neighboring conductive features, while materials having relatively lower dielectric constants decrease capacitive coupling between neighboring conductive features. It is therefore desirable to separate neighboring conductive features with low dielectric constant (commonly referred to as "low-k") materials.

Air has a dielectric constant slightly larger than 1.0 (1.0 being the lowest possible dielectric constant). Accordingly, one approach to reducing capacitive coupling between neighboring conductive features has been to form air gaps between the neighboring conductive features. Unfortunately, conventional methods of form air gaps between the neighboring conductive features may result in one or more of undesirable damage to the conductive features (e.g., when a conductive material is subjected to a subtractive process, such as an etching process, to form the air gaps), inconsistent air gap formation, undesirable air gap dimensions (e.g., undesirably small air gap dimensions) and/or shapes, and undesirable amounts of relatively higher dielectric constant material(s) between the air gaps and the neighboring conductive features (which can cut against the benefits of the low dielectric constant of the air).

A need, therefore, exists for new, simple, and cost-efficient methods of forming electronic devices including air gaps between neighboring conductive features (e.g., neighboring conductive structures, such as neighboring interconnect structures) thereof, as well as for related electronic devices and electronic systems.

DETAILED DESCRIPTION

Figure 1A:
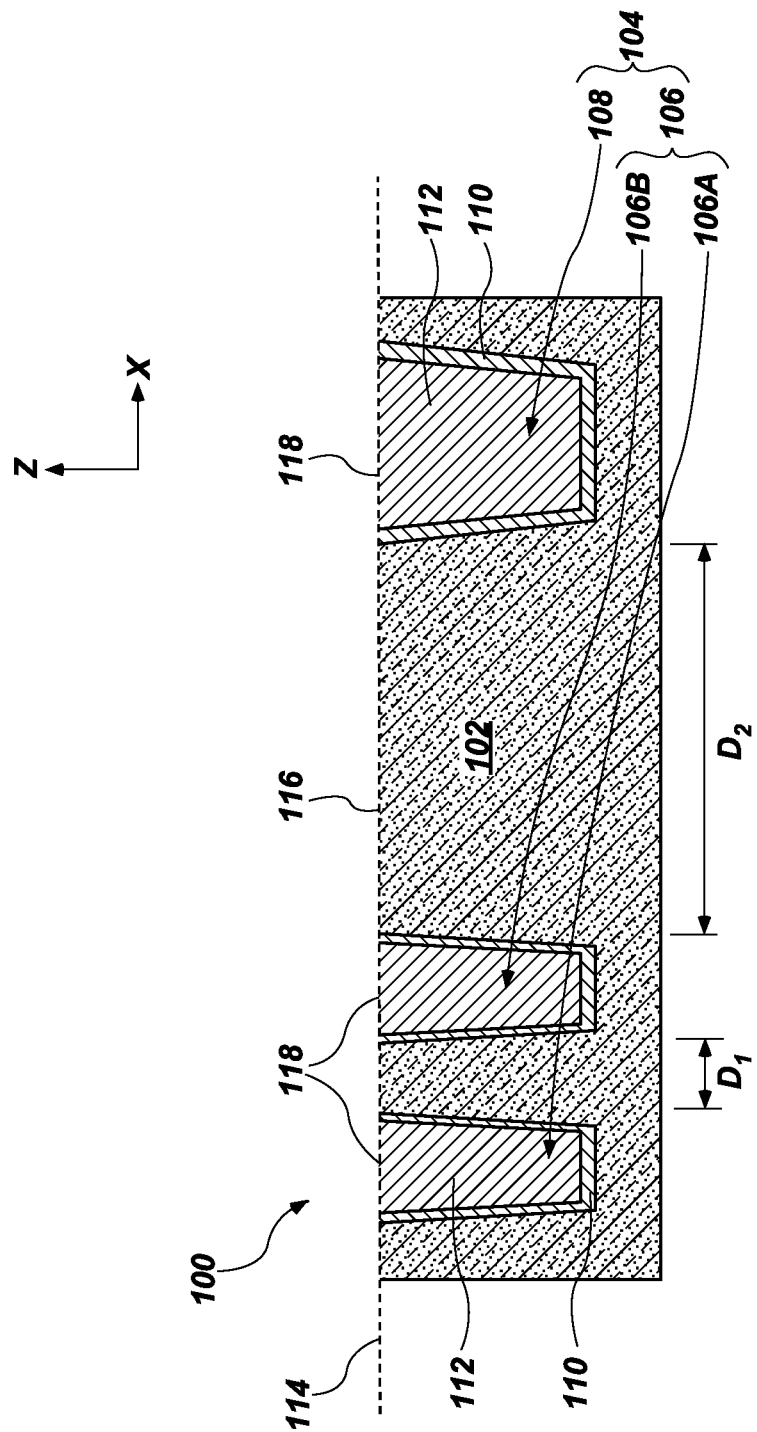
FIGS. 1A through 1F are simplified, partial cross-sectional views illustrating a method of forming an electronic device structure of an electronic device, in accordance with embodiments of the disclosure.

Methods of forming electronic devices are described herein, as are related electronic devices, and electronic systems. In some embodiments, a method of forming an electronic device comprises forming interconnect structures vertically extending into a dielectric structure. The interconnect structures each individually include a conductive material and a barrier material intervening between the conductive material and the dielectric structure. Upper portions of the dielectric structure are selectively removed to form trenches between upper portions of the interconnect structures. An additional barrier material is conformally formed on or over surfaces of the interconnect structures and the dielectric structure inside and outside of the trenches. A sacrificial material is formed on or over the additional barrier material such that one or more of the trenches remain substantially free of the sacrificial material therein. The sacrificial material exhibits one or more slots vertically extending therethrough to one or more remaining portion of the one or more trenches. Portions of the additional barrier material exposed within the one or more of the trenches and portions of dielectric structure thereunder are selectively removed to form at one or more additional trenches vertically extending into the dielectric structure and laterally neighboring two or more of the interconnect structures. An isolation material is formed on or over surfaces of the additional barrier material outside of the one or more additional trenches to form one or more air gaps between the two or more of the interconnect structures. The methods of the disclosure may facilitate increased reliability and performance in electronic device structures, electronic devices, and electronic systems that rely on high feature density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing an electronic device. The electronic device structures described below do not form a complete electronic device. Only those process acts and structures necessary to understand the embodiments of the disclosure are described in detail below. Additional acts to form the complete electronic device from the electronic device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, reference to a feature as being "over" an additional feature means and includes the feature being directly on top of, adjacent to (e.g., laterally adjacent to, vertically adjacent to), underneath, or in direct contact with the additional feature. It also includes the element being indirectly on top of, adjacent to (e.g., laterally adjacent to, vertically adjacent to), underneath, or near the additional feature, with other features located therebetween. In contrast, when an element is referred to as being "on" or another element, there are no intervening features therebetween.

As used herein, "vertically-neighboring" or "longitudinally-neighboring" features (e.g., structures, devices) means and includes features located most vertically proximate (e.g., vertically closest) one another. In addition, as used herein, "horizontally-neighboring" or "laterally-neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD (PECVD)), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1F are simplified partial cross-sectional views illustrating embodiments of a method of forming an electronic device structure (e.g., a semiconductor device structure, a memory device structure) of an electronic device (e.g., a semiconductor device, a memory device). With the description provided below, it will be readily apparent to one of ordinary skill in the art that the methods described herein may be used in various devices. In other words, the methods of the disclosure may be used whenever it is desired to form an electronic device.

Referring to FIG. 1A, an electronic device structure 100 may be formed to include a dielectric structure 102 and interconnect structures 104 (e.g., line structures, routing structures) within (e.g., filling) trenches (e.g., openings) in the dielectric structure 102. The interconnect structures 104 may be in electrical communication with and may facilitate electrical communication between different components (e.g., different devices, such as memory cells and control logic devices) of an electronic device including a subsequent form (e.g., following additional processing) of the electronic device structure 100, as described in further detail.

The dielectric structure 102 may be formed of and include one or more dielectric materials. By way of non-limiting example, the dielectric structure 102 may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), and a titanium oxide ($TiO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., a silicon oxycarbide ($SiO_xC_z$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the dielectric structure 102 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the dielectric structure 102 is formed of and includes silicon dioxide ($SiO_2$). The dielectric structure 102 may be substantially homogeneous throughout a thickness (e.g., vertical height in the Z-direction) thereof, or may be substantially heterogeneous throughout the thickness thereof. In some embodiments, the dielectric structure 102 is substantially homogeneous throughout the thickness thereof. For example, the dielectric structure 102 may formed of and include a single (e.g., only one) dielectric material. In additional embodiments, the dielectric structure 102 is substantially heterogeneous throughout the thickness thereof. For example, the dielectric structure 102 may be formed of and include a stack (e.g., laminate) of at least two different dielectric materials.

The interconnect structures 104 may include one or more relatively narrower interconnect structures 106 (e.g., narrower line structures, narrower routing structures) and one or more relatively wider interconnect structures 108 (e.g., wider line structures, wider routing structures). The interconnect structures 104 may, for example, include at least two (2) narrower interconnect structures 106 and at least one (1) wider interconnect structure 108. As shown in FIG. 1A, the narrower interconnect structures 106 may include a first narrower interconnect structures 106A and a second narrower interconnect structure 106B. The second narrower interconnect structure 106B may laterally-neighbor and laterally intervene between the first narrower interconnect structure 106A and the wider interconnect structure 108. While, for ease and understanding of the disclosure, FIG. 1A depicts the electronic device structure 100 as including two (2) narrower interconnect structures 106 (e.g., the first narrower interconnect structures 106A, and the second narrower interconnect structure 106B) and one (1) wider interconnect structure 108 laterally-neighboring one of the two (2) narrower interconnect structures 106 (e.g., the second narrower interconnect structure 106B), one of ordinary skill in the art will appreciate that the disclosure is not so limited. Rather, the electronic device structure 100 may include a different number and/or a different arrangement of one or more of the narrower interconnect structures 106 and the wider interconnect structures 108. For example, the electronic device structure 100 may include more than two (2) of the narrower interconnect structures 106 and/or more than one (1) of the wider interconnect structures 108. In additional embodiments, the electronic device structure 100 includes the narrower interconnect structures 106 but not the wider interconnect structures 108 (e.g., the interconnect structures 104 only include the narrower interconnect structures 106).

The wider interconnect structure 108 may be from about 1.5 times (1.5×) to about 3 times (3×) wider than each of the narrower interconnect structures 106, such as about 2 times (2×) wider. In some embodiments, the narrower interconnect structures 106 (e.g., the first narrower interconnect structure 106A and the second narrower interconnect structure 106B) each individually have a first width less than or equal to about 200 nanometers (nm) (e.g., less than or equal to about 150 nm, less than or equal to about 100 nm, less than or equal to about 50 nm), and the wider interconnect structure 108 has a second width greater than about 200 nm. (e.g., greater than or equal to 250 nm, greater than or equal to about 300 nm). In addition, at least some laterally-neighboring interconnect structures 104 (e.g., laterally-neighboring narrower interconnect structures 106, laterally-neighboring wider interconnect structures 108, a narrower interconnect structure 106 laterally neighboring a wider interconnect structure 108) may be separated from another (e.g., in the X-direction) by a first distance $D_1$, and at least some other laterally-neighboring interconnect structures 104 (e.g., other laterally-neighboring narrower interconnect structures 106, other laterally-neighboring wider interconnect structure 108, another narrower interconnect structure 106 laterally neighboring another wider interconnect structure 108) may be separated from another (e.g., in the X-direction) by a second distance $D_2$ larger than the first distance $D_1$. For example, as shown in FIG. 1A, two or more laterally-neighboring narrower interconnect structures 106 (e.g., the first narrower interconnect structure 106A and the second narrower interconnect structure 106B) may be separated from one another by the first distance $D_1$, and one or more narrower interconnect structures 106 (e.g., the second narrower interconnect structure 106B) laterally-neighboring one or more wider interconnect structures 108 may be separated therefrom by the second distance $D_2$. In some embodiments, the first distance $D_1$ is less than or equal to about 400 nanometers (nm) (e.g., less than or equal to about 300 nm, less than or equal to about 200 nm, less than or equal to about 100 nm), and the second distance $D_2$ is greater than about 400 nm.

The interconnect structures 104 (e.g., the narrower interconnect structures 106 and the wider interconnect structure 108) may each individually include at least one barrier material 110 on or over surfaces of the dielectric structure 102, and at least one conductive material 112 on or over surfaces of the barrier material 110. For example, as shown in FIG. 1A, each of the interconnect structures 104 may include the barrier material 110 on surfaces of the dielectric structure 102 defining boundaries (e.g., vertical boundaries, horizontal boundaries) of the interconnect structure 104, and the conductive material 112 on surfaces of the barrier material 110. For each of the interconnect structures 104, the barrier material 110 may intervene (e.g., horizontally intervene, vertically intervene) between the dielectric structure 102 and the conductive material 112. For example, as shown in FIG. 1A, the barrier material 110 may laterally extend (e.g., in the X-direction) from and between horizontal boundaries of the conductive material 112 and the dielectric structure 102, and may also vertically extend (e.g., in the Z-direction) from and between vertical boundaries of the conductive material 112 and the dielectric structure 102. In some embodiments, for at least some (e.g., each) of the interconnect structures 104, the barrier material 110 fills portions of trenches in the dielectric structure 102, and the conductive material 112 substantially fills remaining portions (e.g., portions not filled by the barrier material 110) of the trenches in the dielectric structure 102.

The barrier material 110 may be formed of and include at least one material that impedes (e.g., substantially prevents) diffusion of elements of the conductive material 112 into other structures (e.g., the dielectric structure 102) and/or materials. The barrier material 110 may also impede (e.g., substantially prevent) the formation of silicide materials from elements of the conductive material 112 and the dielectric structure 102 that may otherwise effectuate electrical shorts. In some embodiments, such as embodiments wherein the conductive material 112 comprises copper (Cu), the barrier material 110 comprises one or more of a tantalum-containing material, a tungsten-containing material, a titanium-containing material, a cobalt-containing material, a manganese-containing material, and a ruthenium-containing material. For example, the barrier material 110 may be formed of and include one or more of elemental tantalum (Ta), a tantalum nitride ($TaN_y$), elemental tungsten (W), a tungsten nitride ($WN_y$), elemental titanium (Ti), a titanium nitride ($TiN_y$), elemental cobalt (Co), and elemental manganese (Mn). In some embodiments, the barrier material 110 is $TaN_y$. The barrier material 110 may have any thickness able to substantially prevent diffusion of elements of the conductive material 112 into other structures (e.g., the dielectric structure 102) and/or materials adjacent the barrier material 110. By way of non-limiting example, the barrier material 110 may have a thickness less than or equal to about 100 nm, such as within a range of from about 10 nm to about 100 nm (e.g., within a range of from about 10 nm to about 50 nm, within a range of from about 20 nm to about 50 nm, or within a range of from about 20 nm to about 40 nm).

The conductive material 112 may be formed of and include at least one metal material, such as one or more of a Cu-containing material and an aluminum (Al)-containing material. For example, the conductive material 112 may be formed of and include one or more of elemental Cu, a Cu-containing alloy, elemental Al, and an Al-containing alloy. In some embodiments, the conductive material 112 is elemental Cu. The conductive material 112 may be substantially free of void spaces (e.g., air gaps) therein.

As shown in FIG. 1A, upper surfaces 116 of the dielectric structure 102 may be substantially coplanar with upper surfaces 118 of the interconnect structures 104 (including the narrower interconnect structures 106 and the wider interconnect structure(s) 108) about a horizontally-extending plane 114. Put another way, vertically uppermost boundaries of the interconnect structures 104, including vertically uppermost boundaries of the barrier material 110 and the conductive material 112 thereof, may be substantially coplanar with vertically uppermost boundaries of the dielectric structure 102.

The dielectric structure 102 and the interconnect structures 104 may be formed using conventional processes (e.g., conventional material deposition processes, conventional photolithography processes, conventional material removal processes) and conventional processing equipment, which are not described in detail herein. For example, a dielectric material may be formed on or over one or more structures and devices through at least one material deposition process (e.g., a PVD process, a CVD process; an ALD process; a spin-coating process) and then subjected to at least one etching process (e.g., one or more of reactive ion etching (RIE), deep RIE, plasma etching, reactive ion beam etching, and chemically assisted ion beam etching) to form the dielectric structure 102 including trenches therein. Thereafter, the barrier material 110 may be conformally deposited (e.g., through one or more of an ALD process and a conformal CVD process) on surfaces of the dielectric structure 102 inside and outside of the trenches, a conductive seed material (e.g., one or more of elemental Cu and a Cu alloy, such as a copper-manganese (CuMn) alloy) may be deposited (e.g., through a PVD process) on surfaces of the barrier material 110 inside and outside of the trenches, and then the conductive material 112 (e.g., elemental Cu) may be formed (e.g., electroplated, electrolessly plated) on or over the conductive seed material to fill (e.g., substantially fill) remaining portions of the trenches. Subsequently, at least portions of the barrier material 110 and the conductive material 112 outside of the trenches in the dielectric structure 102 may be removed (e.g., through at least one CMP process) to form the interconnect structures 104.

Figure 1B:
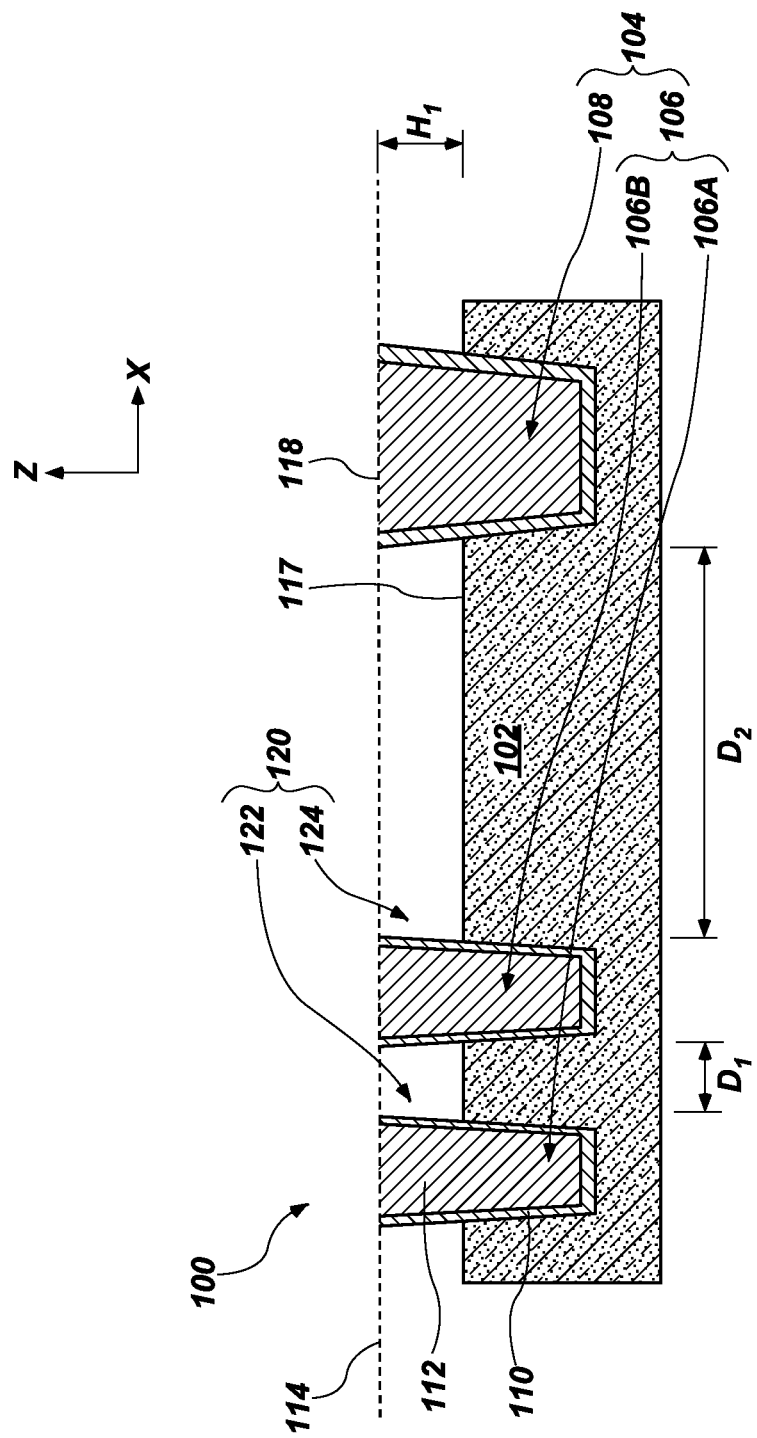

Referring next to FIG. 1B, upper portions of the dielectric structure 102 may be selectively removed to form recessed upper surfaces 117 of the dielectric structure 102. As shown in FIG. 1B, the recessed upper surfaces 117 of the dielectric structure 102 may be vertically offset from the upper surfaces 118 of the interconnect structures 104 by a height $H_1$ (e.g., depth, vertical distance). The height $H_1$ may be selected at least partially based on a predetermined thickness of an additional barrier material to subsequently be formed on or over surfaces of the dielectric structure 102 and the interconnect structures 104, as described in further detail below. By way of non-limiting example, the height $H_1$ of the vertical offset between the recessed upper surfaces 117 of the dielectric structure 102 and the upper surfaces 118 of the interconnect structures 104 may have a magnitude greater than or equal to about 1.5 times (1.5×) the predetermined thickness of the additional barrier material, such as within a range of from about 1.5 times (1.5×) the predetermined thickness to about 3.0 times (3.0×) the predetermined thickness, within a range of from about 1.5 times (1.5×) the predetermined thickness to about 2.5 times (2.5×) the predetermined thickness, or within a range from about 1.5 times (1.5×) the predetermined thickness to about 2.0 times (2.0×) the predetermined thickness. If, for example, the thickness of the additional barrier material is selected to be about 30 nm, the height $H_1$ of the vertical offset between the recessed upper surfaces 117 of the dielectric structure 102 and the upper surfaces 118 of the interconnect structures 104 may be within a range of from about 45 nm to about 90 nm, such as within a range of from about 45 nm to about 75 nm, or within a range of from about 45 nm to about 60 nm. As another example, if the thickness of the additional barrier material is selected to be about 50 nm, the height $H_1$ of the vertical offset between the recessed upper surfaces 117 of the dielectric structure 102 and the upper surfaces 118 of the interconnect structures 104 may be within a range of from about 75 nm to about 150 nm, such as within a range of from about 75 nm to about 125 nm, or within a range of from about 75 nm to about 100 nm. In some embodiments, the height $H_1$ is within a range of from about 50 nm to about 100 nm. In additional embodiments, the height $H_1$ of the vertical offset between the recessed upper surfaces 117 of the dielectric structure 102 and the upper surfaces 118 of the interconnect structures 104 is selected to be less than half (½) of an overall height (e.g., vertical dimension in the Z-direction) of the interconnect structures 104.

The selective removal of the upper portions of the dielectric structure 102 forms trenches 120 at least partially defined by the recessed upper surfaces 117 of the dielectric structure 102 and exposed upper portions of side surfaces (e.g., sidewalls) of the interconnect structures 104. The trenches 120 may include at least one first trench 122, and at least one second trench 124 having different lateral dimensions (e.g., in the X-direction) than the first trench 122. As shown in FIG. 1B, in some embodiments, the first trench 122 laterally extends (e.g., in the X-direction) from and between laterally-neighboring narrower interconnect structures 106 (e.g., the first narrower interconnect structure 106A and the second narrower interconnect structure 106B), and the second trench 124 laterally extends (e.g., in the X-direction) from at least one of the narrower interconnect structures 106 (e.g., the second narrower interconnect structure 106B) to at least one wider interconnect structure 108. The first trench 122 may have a width corresponding to (e.g., substantially the same as) the first distance $D_1$ between the laterally-neighboring narrower interconnect structures 106, and the second trench 124 may have another width corresponding to (e.g., substantially the same as) the second distance $D_2$ between the narrower interconnect structure 106 (e.g., the second narrower interconnect structure 106B) and the wider interconnect structure 108 laterally-neighboring the narrower interconnect structure 106.

The upper portions of the dielectric structure 102 may be selectively removed by treating the electronic device structure 100 with at least one etchant (e.g., at least one wet etchant) formulated to remove exposed portions of the dielectric structure 102 without substantially removing exposed portions of the interconnect structures 104 (including exposed portions of the barrier material 110 and the conductive material 112 thereof). By way of non-limiting example, the etchant may comprise one or more of hydrofluoric acid (HF), and a buffered oxide etchant (BOE). In some embodiments, the etchant comprises a solution including water and HF at a ratio within a range of from about 500:1 to about 100:1. The electronic device structure 100 may be exposed to the etchant using conventional processes (e.g., spin-coating process, a spray-coating process, an immersion-coating process, a vapor-coating process, a soaking process, combinations thereof) and conventional processing equipment, which are not described in detail herein.

Figure 1C:
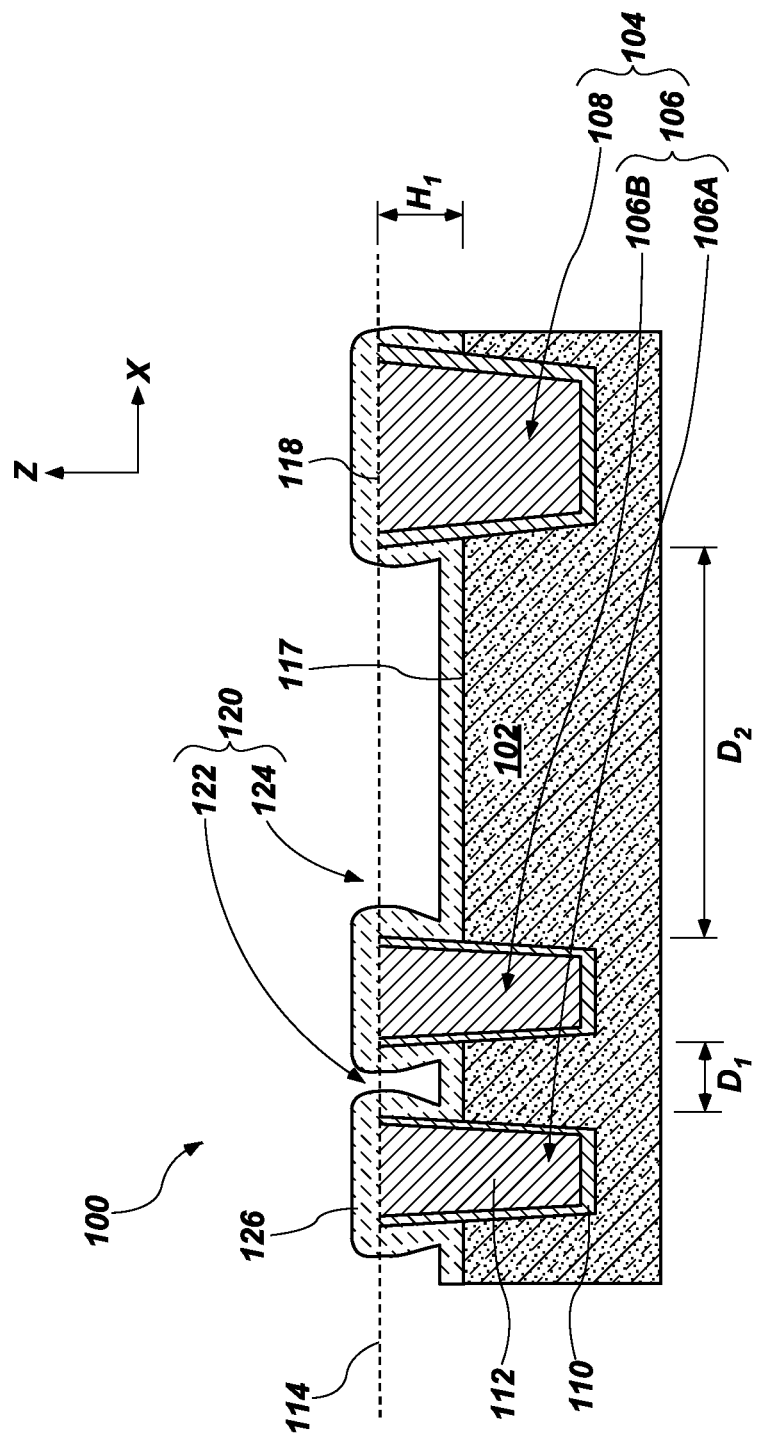

Referring next to FIG. 1C, an additional barrier material 126 may be formed on or over exposed (e.g., uncovered, bare) surfaces of the electronic device structure 100 (e.g., exposed surfaces of the dielectric structure 102 and the interconnect structures 104). As shown in FIG. 1C, the additional barrier material 126 may at least partially (e.g., substantially) conform to a topography defined by the surfaces (e.g., upper surfaces, side surfaces) upon which the additional barrier material 126 is formed. The additional barrier material 126 may extend (e.g., continuously extend) over surfaces of the dielectric structure 102 (e.g., the recessed upper surfaces 117) and the interconnect structures 104 (e.g., the upper surfaces 118, side surfaces) inside and outside of the trenches 120 (including the first trench 122 and the second trench 124). As shown in FIG. 1C, the additional barrier material 126 partially (e.g., less than completely) fills the trenches 120. The additional barrier material 126 may be formed to any desired thickness, at least partially depending the lateral distances (e.g., the first distance $D_1$, the second distance $D_2$) between laterally-neighboring interconnect structures 104. By way of non-limiting example, the additional barrier material 126 may be formed to have a thickness within a range of from about 10 nm to about 100 nm, such as from about 20 nm to about 75 nm, or from about 30 nm to about 50 nm. In some embodiments, the additional barrier material 126 is formed to exhibit a thickness within a range of from about 30 nm to about 50 nm.

The additional barrier material 126 is formed of and includes a material having etch selectivity relative to the dielectric structure 102. As described in further detail below, portions of the dielectric structure 102 may be selectively removed relative to the additional barrier material 126. For example, the additional barrier material 126 may be formed of and include a relatively low-k dielectric material, such as a Barrier LOw K (BLOK) material. The low-k dielectric material (e.g., BLOK material) may be formed of and include at least one dielectric material having a lower dielectric constant (k) than silicon nitride ($Si_3N_4$) (e.g., a k less than about 6.0), such as one or more of a silicon carbide ($SiC_y$), a silicon carbon nitride ($SiC_yN_z$), a silicon oxycarbide ($SiO_xC_y$), a silicon oxynitride ($SiO_xN_y$), a hydrogenated silicon oxycarbide ($SiC_xO_yH_z$), and a silicon oxycarbonitride ($SiO_xC_yN_z$). In some embodiments, the additional barrier material 126 is formed of and includes $SiC_yN_z$. In additional embodiments, the additional barrier material 126 is formed of and includes a different dielectric material (e.g., a dielectric material other than a low-k dielectric material) having etch selectivity relative to the dielectric structure 102. As a non-limiting example, the additional barrier material 126 may be formed of and include $Si_3N_4$.

The additional barrier material 126 may be formed (e.g., conformally formed) using conventional processes (e.g., conventional conformal deposition processes), which are not described in detail herein. By way of non-limiting example, the additional barrier material 126 may be formed by way of one or more of a conventional CVD process (e.g., a conventional PECVD process) and a conventional ALD process. In some embodiments, the additional barrier material 126 is formed on exposed surfaces of the dielectric structure 102 and the interconnect structures 104 using a PECVD process.

In further embodiments, the additional barrier material 126 comprises discrete capping structures on or over the upper surfaces 118 of the interconnect structures 104. The recessed upper surfaces 117 of the dielectric structure 102 may be substantially free of the additional barrier material 126, such that the additional barrier material 126 is substantially confined within the lateral boundaries of the upper surfaces 118 of the interconnect structures 104. In such embodiments, the additional barrier material 126 may be formed of and include one or more of at least one dielectric material (e.g., a low-k dielectric material, such one or more of $SiC_y$, $SiC_yN_z$, $SiO_xC_y$, $SiO_xN_y$, $SiC_xO_yH_z$, and $SiO_xC_yN_z$) and at least one conductive material (e.g., one or more of elemental tungsten (W), elemental cobalt (Co), alloys thereof, and combinations thereof). If employed, the discrete capping structures may be formed on or over the upper surfaces 118 of the interconnect structures 104 using conventional processes (e.g., conventional deposition processes, conventional photolithographic patterning processes, conventional material removal processes), which are not described in detail herein.

Figure 1D:
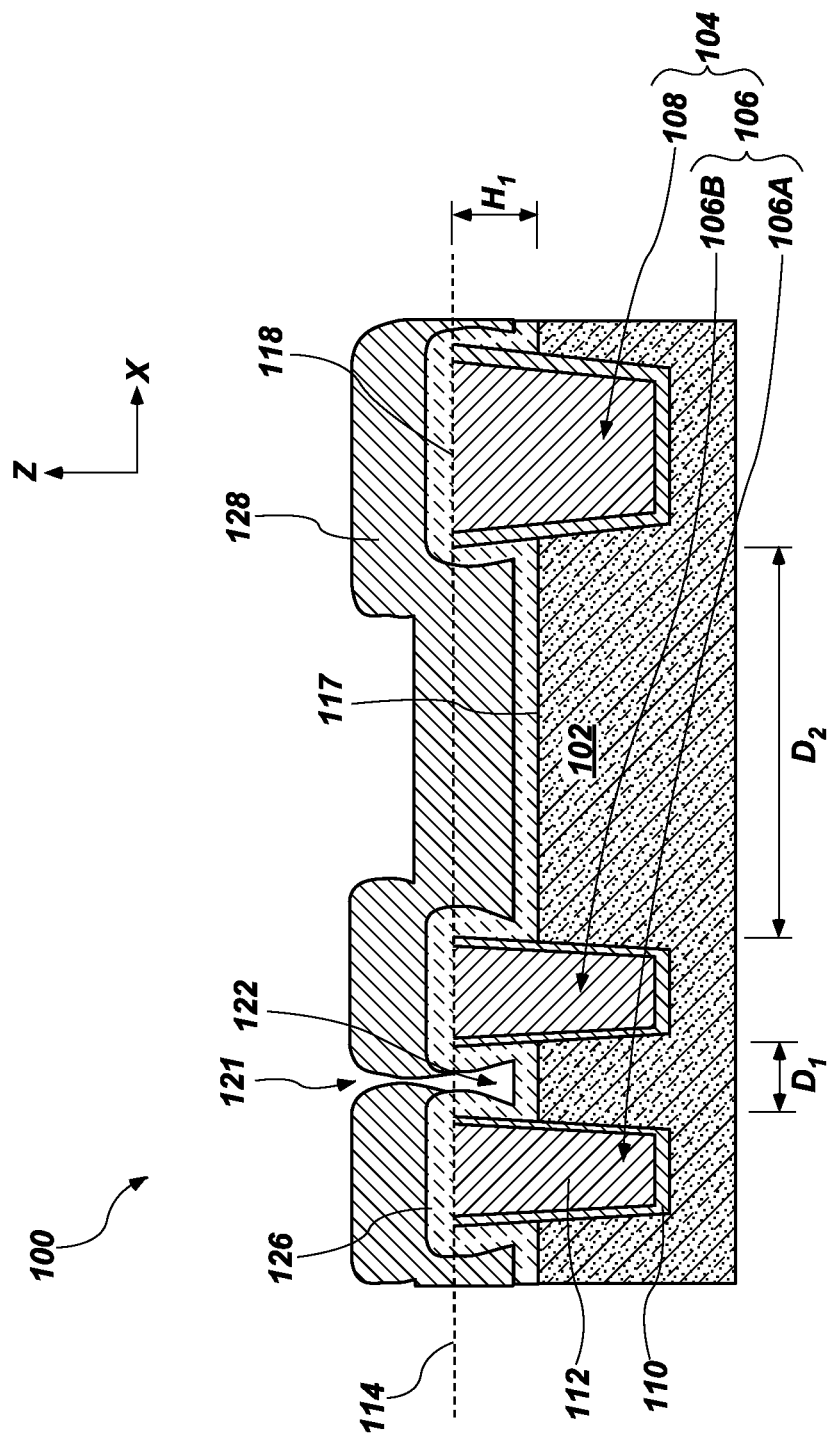

Referring next to FIG. 1D, a sacrificial material 128 may be formed on or over the additional barrier material 126. The sacrificial material 128 may partially conform to a topography defined by the surfaces (e.g., upper surfaces, side surfaces) of the additional barrier material 126. The sacrificial material 128 may substantially fill portions of the second trench 124 (FIG. 1C) not occupied by the additional barrier material 126, but may not substantially fill portions of the first trench 122 not occupied by the additional barrier material 126. In some embodiments, the sacrificial material 128 is formed such that the first trench 122 remains substantially free of the sacrificial material 128 therein. As shown in FIG. 1D, the sacrificial material 128 is formed to exhibit at least one slot 121 (e.g., aperture, slit, gap, via) therein at a location (or locations) overlying the at least one first trench 122. The slot 121 may vertically extend completely through the sacrificial material 128 to remaining portions (e.g., portions not occupied by the additional barrier material 126) of first trench 122, such that the sacrificial material 128 is discontinuous at a location overlying the first trench 122; or may vertically extend only partially through the sacrificial material 128, such that the sacrificial material 128 is continuous but recessed at a location overlying the first trench 122. In some embodiments, the slot 121 vertically extends completely through the sacrificial material 128. The sacrificial material 128 may be formed to any desired thickness facilitating the formation of the slot 121 therein at a location overlying the first trench 122. The thickness of sacrificial material 128 may at least partially depend on the lateral distances (e.g., the first distance $D_1$, the second distance $D_2$) between laterally-neighboring interconnect structures 104, and on the thickness of the additional barrier material 126. By way of non-limiting example, the sacrificial material 128 may be formed to have a thickness within a range of from about 10 nm to about 200 nm, such as from about 20 nm to about 150 nm, from about 20 nm to about 100 nm, or from about 30 nm to about 50 nm. In some embodiments, the sacrificial material 128 is formed to exhibit a thickness within a range of from about 30 nm to about 50 nm.

As described in further detail below, the sacrificial material 128 may be employed as a mask for the selective removal of portions of the additional barrier material 126 within the first trench 122. The sacrificial material 128 may, for example, be formed of and include at least one dielectric material having a material composition different than that of the additional barrier material 126, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amphorous carbon. In some embodiments, the sacrificial material 128 comprises $SiO_2$.

The sacrificial material 128 may be formed using conventional processes (e.g., conventional deposition processes), which are not described in detail herein. By way of non-limiting example, the sacrificial material 128 may be formed by way of a conventional CVD process (e.g., a conventional PECVD process). In some embodiments, the additional barrier material 126 is formed on exposed surfaces of the additional barrier material 126 using a silicon-containing precursor (e.g., silane ($SiH_4$)) and an oxygen-containing reactant (e.g., nitrogen oxide ($N_2O$)) through a conventional PECVD process.

Figure 1E:
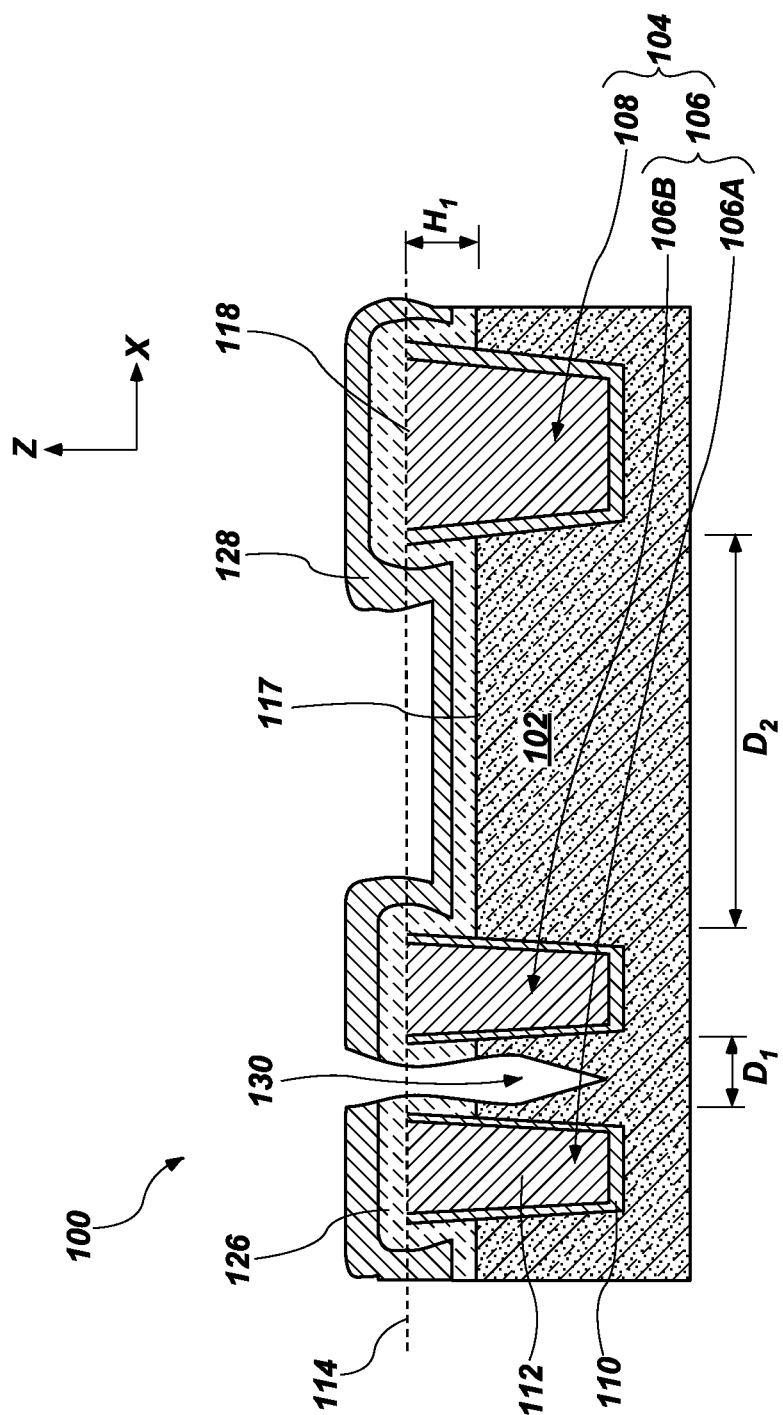

Referring next to FIG. 1E, portions of the additional barrier material 126 within the first trench 122 (FIG. 1D) may be removed (commonly referred to in the art as "punched through"), along with portions of the dielectric structure 102 vertically underlying the first trench 122 (FIG. 1D), to form at least one additional trench 130 vertically-extending (e.g., in the Z-direction) into the dielectric structure 102 and laterally intervening (e.g., in the X-direction) between some laterally-neighboring interconnect structures 104 (e.g., at least some laterally-neighboring narrower interconnect structures 106, such as the first narrower interconnect structure 106A and the second narrower interconnect structure 106B). As shown in FIG. 1E, at least a portion (e.g., less than all, or substantially all) of the sacrificial material 128 may also be removed, to reduce a thickness of the sacrificial material 128.

The additional trench 130 may be formed to vertically extend (e.g., in the Z-direction) to a location within the dielectric structure 102 vertically above, vertically at, or vertically below lower vertical boundaries of the interconnect structures 104. As shown in FIG. 1E, in some embodiments, the additional trench 130 vertically terminates at a location vertically at or substantially vertically proximate lower vertical boundaries of the conductive material 112 of the interconnect structures 104. In additional embodiments, more of the dielectric structure 102 is removed, such that the additional trench 130 vertically terminates at a location vertically below the lower vertical boundaries of the conductive material 112 of the interconnect structures 104. In further embodiments, less of the dielectric structure 102 is removed, such that the additional trench 130 vertically terminates at a location vertically above the lower vertical boundaries of the conductive material 112 of the interconnect structures 104. In addition, as shown in FIG. 1E, the additional trench 130 may be formed such that a width (e.g., in the X-direction) thereof is smaller than the distance (e.g., the distance $D_1$) between the laterally-neighboring interconnect structures 104 (e.g., laterally-neighboring narrower interconnect structures 106, such as the first narrower interconnect structure 106A and the second narrower interconnect structure 106B) between which the additional trench 130 laterally intervenes. Accordingly, portions of the dielectric structure 102 may laterally intervene (e.g., in the X-direction) between the additional trench 130 and the interconnect structures 104 (e.g., the narrower interconnect structures 106) laterally neighboring the additional trench 130. Put another way, lower portions of side surfaces (e.g., sidewalls) of the interconnect structures 104 may remain substantially covered by the dielectric material of the dielectric structure 102. In additional embodiments, the additional trench 130 is formed to laterally extend to side surfaces of one or more (e.g., each) of the interconnect structures 104 between which the additional trench 130 laterally intervenes. For example, the additional trench 130 may be formed to laterally extend from and between opposing side surfaces of the laterally-neighboring interconnect structures 104 (e.g., laterally-neighboring narrower interconnect structures 106) between which the additional trench 130 laterally intervenes.

The additional trench 130 in the dielectric structure 102 may be formed using one or more conventional material removal processes, which are not described in detail herein. For example, portions of the additional barrier material 126 within the first trench 122 (FIG. 1D) and portions of the dielectric structure 102 thereunder may be removed using a first material removal process to form preliminary trenches in the dielectric structure 102, and then additional portions of the dielectric structure 102 may be selectively removed using a second material removal process to enlarge (e.g., vertically enlarge, horizontally enlarge) the preliminary trenches and form the additional trench 130. The first material removal process may, for example, comprise an anisotropic dry etching process, such as one or more of reactive ion etching (RIE), deep RIE, plasma etching, reactive ion beam etching, and chemically assisted ion beam etching. In some embodiments, the first material removal process is an RIE process. The second material removal process may, for example, comprise treating the electronic device structure 100 with at least one wet etchant, such as one or more HF and BOE. The electronic device structure 100 may be exposed to the wet etchant using conventional processes (e.g., spin-coating process, a spray-coating process, an immersion-coating process, a vapor-coating process, a soaking process, combinations thereof) and conventional processing equipment, which are not described in detail herein. In some embodiments, the second material removal process is a wet etching process employing a wet etchant comprising a solution including water and HF at a ratio within a range of from about 500:1 to about 100:1.

Figure 1F:
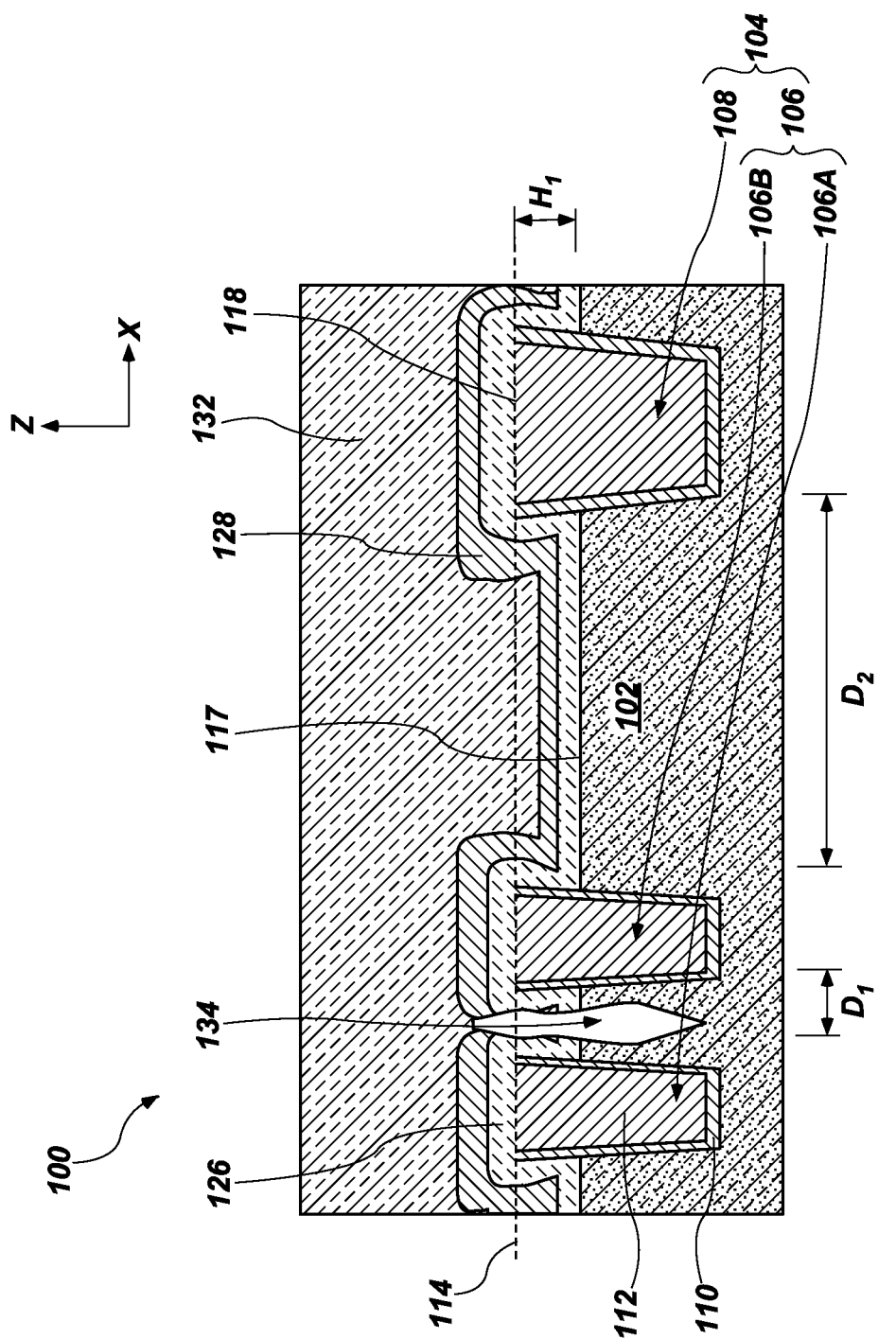

Referring next to FIG. 1F, an isolation material 132 (e.g., an interlayer dielectric (ILD) material) may be non-conformally formed over exposed surfaces of the electronic device structure 100. The isolation material 132 may exhibit a substantially planar upper boundary (e.g., upper surface), and a non-planar lower boundary partially defined by the topography of the surfaces (e.g., upper surfaces, outer side surfaces) of one or more of the sacrificial material 128 and the additional barrier material 126. The isolation material 132 may be formed on or over surfaces (e.g., upper surfaces, outer side surfaces) of one or more of the sacrificial material 128 and the additional barrier material 126 outside of the additional trenches 130 (FIG. 1E) without substantially filling the additional trench 130 (FIG. 1E) with the isolation material 132 below upper vertical boundaries (e.g., the upper surfaces 118) of the interconnect structures 104. Accordingly, at least one air gap 134 corresponding to a portion of the additional trench 130 (FIG. 1E) remaining unfilled with the isolation material 132 may laterally intervene (e.g., in the X-direction) between laterally-neighboring interconnect structures 104 (e.g., laterally-neighboring narrower interconnect structures 106, such as the first narrower interconnect structure 106A and the second narrower interconnect structure 106B) following the formation of the isolation material 132. The air gap 134 may serve as an insulator having a dielectric constant (k) of about 1. The air gap 134 may limit capacitance (e.g., parasitic capacitance, stray capacitance) and increase shorts margin between laterally-neighboring interconnect structures 104, and may reduce cross-talk between laterally-neighboring interconnect structures 104.

The isolation material 132 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amorphous carbon. In some embodiments, the isolation material 132 comprises $SiO_2$.

The air gap 134 may vertically extend from a location vertically above, vertically at, or vertically below upper vertical boundaries of the interconnect structures 104 to an additional location vertically below, vertically at, or vertically above lower vertical boundaries of the interconnect structures 104. As shown in FIG. 1F, in some embodiments, the air gap 134 vertically extends from a location vertically above upper vertical boundaries of the interconnect structures 104 (e.g., vertically above the horizontally-extending plane 114 shared by the upper surfaces 118 of the interconnect structures 104) to an additional location vertically above lower vertical boundaries of the interconnect structures 104. The air gap 134 may, for example, vertically extend from a location vertically at or vertically above uppermost boundaries of the additional barrier material 126 to an additional location vertically at or substantially vertically proximate lower vertical boundaries of the conductive material 112 of the interconnect structures 104. In additional embodiments, the air gap 134 may vertically extend from a different location (e.g., a location vertically at or vertically below upper vertical boundaries of the interconnect structures 104) and/or may vertically terminate at a different additional location (e.g., an additional location vertically above the lower boundaries of the interconnect structures 104, an additional location vertically at the lower boundaries of the interconnect structures 104, an additional location vertically below the lower boundaries of the interconnect structures 104). As shown in FIG. 1F, the additional barrier material 126 may laterally intervene (e.g., in the X-direction) between an upper portion of the air gap 134 (e.g., a portion of the air gap 134 vertically above the recessed upper surfaces 117 of the dielectric structure 102) and upper portions of the interconnect structures 104 (e.g., the first narrower interconnect structure 106A and the second narrower interconnect structure 106B) laterally-neighboring the air gap 134, but the additional barrier material 126 may not laterally intervene (e.g., in the X-direction) between a lower portion of the air gap 134 (e.g., a portion of the air gap 134 vertically extending into the dielectric structure 102) and lower portions of the interconnect structures 104 laterally-neighboring the air gap 134.

The isolation material 132 may be formed using conventional processes (e.g., conventional deposition processes, conventional material removal processes) and conventional processing equipment, which are not described in detail herein. For example, the isolation material 132 may be formed on or over portions of the exposed surfaces of the electronic device structure 100 using one or more conventional non-conformal deposition processes (e.g., at least one conventional non-conformal PVD process). Thereafter, the isolation material 132 may be subjected to at least one conventional planarization process (e.g., at least one conventional CMP process) to facilitate or enhance the planarity of an upper boundary (e.g., upper surface) of the isolation material 132.

Thus, in accordance with embodiments of the disclosure, a method of forming an electronic device comprises forming interconnect structures vertically extending into a dielectric structure, the interconnect structures each comprising a conductive material and a barrier material intervening between the conductive material and the dielectric structure. The dielectric structure is recessed relative to the interconnect structures to form trenches between upper portions of the interconnect structures. An additional barrier material is conformally formed over surfaces of the interconnect structures and the dielectric structure inside and outside of the trenches. A sacrificial material is formed over the additional barrier material such that at least one of the trenches remains substantially free of the sacrificial material therein, the sacrificial material exhibiting a slot vertically extending therethrough to a remaining portion of the at least one of the trenches. Portions of the additional barrier material exposed within the at least one of the trenches and portions of dielectric structure thereunder are selectively removed to form at least one additional trench vertically extending into the dielectric structure and laterally neighboring at least two of the interconnect structures. An isolation material is formed over surfaces of the additional barrier material outside of the at least one additional trench to form at least one enclosed air gap between the at least two of the interconnect structures.

Furthermore, an electronic device according to embodiments of the disclosure comprises a dielectric structure, interconnect structures extending into the dielectric structure and having uppermost vertical boundaries above uppermost vertical boundaries of the dielectric structure, an additional barrier material covering surfaces of the interconnect structures above the uppermost vertical boundaries of the dielectric structure, an isolation material overlying the additional barrier material, and at least one air gap laterally intervening between at least two of the interconnect structures laterally-neighboring one another. Each of the interconnect structures comprises a conductive material, and a barrier material intervening between the conductive material and the dielectric structure. The at least one air gap vertically extends from a lower portion of the isolation material, through the additional barrier material, and into the dielectric structure.

Moreover, an electronic device according to additional embodiments of the disclosure comprises a dielectric structure; a first interconnect structure comprising a first portion and a second portion, the first portion embedded in the dielectric structure, and the second portion continuous with the first portion and protruding from the dielectric structure; a second interconnect structure extending substantially parallel to the first interconnect structure and comprising a third portion and a fourth portion, the third portion embedded in the dielectric structure, and the fourth portion continuous with the third portion and protruding from the dielectric structure; and an air gap in the dielectric structure between the first portion of the first interconnect structure and the third portion of the second interconnect structure.

One of ordinary skill in the art will appreciate that, in accordance with additional embodiments of the disclosure, the process steps, features, and feature configurations described above in relation to one or more of FIGS. 1A through 1F may be readily adapted to the design needs of different electronic devices (e.g., different semiconductor devices, different memory devices). By way of non-limiting example, FIGS. 2A through 2D are simplified partial cross-sectional views illustrating embodiments of a method of forming another electronic device structure of the disclosure. Throughout FIGS. 2A through 2D and the associated description below, functionally similar features (e.g., structures, materials) are referred to with similar reference numerals incremented by 100. To avoid repetition, not all features shown in FIGS. 2A through 2D are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature.

Figure 2A:
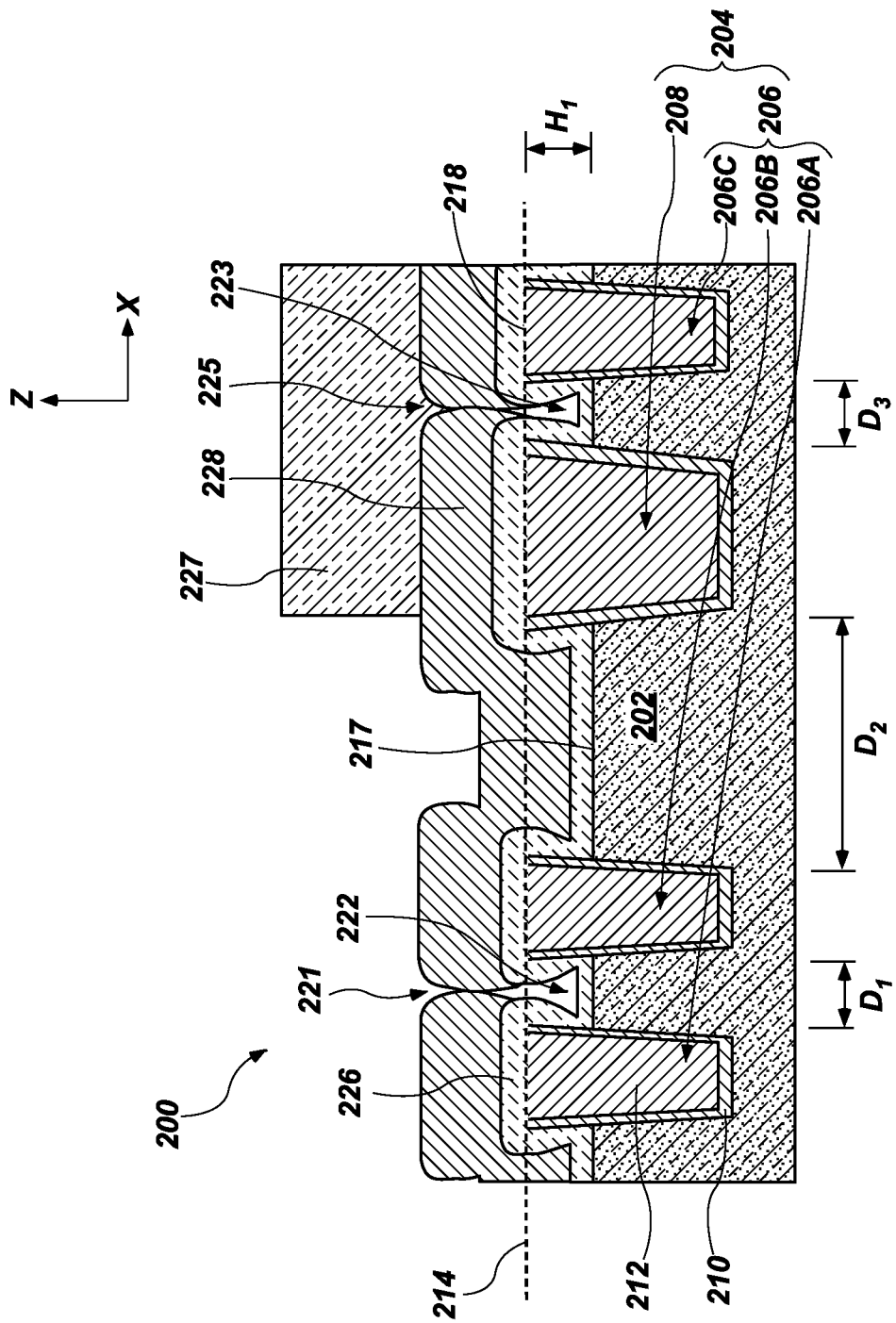
FIGS. 2A through 2D are simplified, partial cross-sectional views illustrating a method of forming an electronic device structure of an electronic device, in accordance with additional embodiments of the disclosure.

FIG. 2A illustrates a simplified partial cross-sectional view of an electronic device structure 200, in accordance with additional embodiments of the disclosure. The electronic device structure 200 is similar to the electronic device structure 100 at the processing stage shown in FIG. 1D, except a third relatively narrower interconnect structure 206C laterally neighbors the relatively wider interconnect structure 208, a third trench 223 laterally intervenes between the relatively wider interconnect structure 208 and the third relatively narrower interconnect structure 206C, and a photoresist structure 227 overlies portions of at least the sacrificial material 228 vertically overlying the relatively wider interconnect structure 208 and the third relatively narrower interconnect structure 206C. The electronic device structure 200 may be formed using processes substantially similar to those previously described herein with reference to FIGS. 1A through 1D, with addition of further processing to form the photoresist structure 227, as described in further detail below.

As shown in FIG. 2A, the third narrower interconnect structure 206C may be separated from the wider interconnect structure 208 by a third distance $D_3$ that is shorter than the second distance $D_2$ between the wider interconnect structure 208 and the second narrower interconnect structure 206B. The third distance $D_3$ may be substantially the same as, or may be different than (e.g., less than, greater than) the first distance $D_1$ between the first narrower interconnect structure 206A and the second narrower interconnect structure 206B. In some embodiments, the third distance $D_3$ is substantially the same as the first distance $D_1$. By way of non-limiting example, the third distance $D_3$ may be less than or equal to about 400 nm, such as less than or equal to about 300 nm, less than or equal to about 200 nm, or less than or equal to about 100 nm.

The third trench 223 may have a width (e.g., in the X-direction) corresponding to (e.g., substantially the same as) the third distance $D_3$ between the wider interconnect structure 208 and the third narrower interconnect structure 206C. In addition, the third trench 223 may exhibit substantially the same height $H_1$ (e.g., in the Z-direction) as the first trench 222. The dimensions and shape of the third trench 223 may be substantially the same as the dimensions and shape of the first trench 222, or one or more of the dimensions and shape of the third trench 223 may be different than one or more of dimensions and shape of the first trench 222. In some embodiments, the dimensions and shape of the third trench 223 are substantially the same as the dimensions and shape of the first trench 222. In addition, similar to the first trench 222, the additional barrier material 126 may extend over surfaces of the dielectric structure 202 (e.g., recessed upper surfaces 217) and the interconnect structures 204 inside the third trench 224, but the third trench 223 may be substantially free of the sacrificial material 228 therein.

With continued reference to FIG. 2A, the photoresist structure 227 may serve as a mask to protect portions of the sacrificial material 228, the additional barrier material 226, and the dielectric structure 202 vertically thereunder from removal during subsequent processing, as described in further detail below. The photoresist structure 227 may be formed on or over a portion of the upper surface of sacrificial material 228, and may vertically overlie (e.g., in the Z-direction) and substantially laterally extend (e.g., in the X-direction) across and between at least two of the interconnect structures 204 laterally-neighboring one another (e.g., the wider interconnect structure 208 and the third narrower interconnect structure 206C). As shown in FIG. 2A, the photoresist structure 227 may cover an additional slot 225 (e.g., an additional aperture, an additional gap, an additional opening) in the sacrificial material 228 vertically overlying the third trench 223. The additional slot 225 in the sacrificial material 228 may exhibit substantially the same dimensions and the substantially same shape as the slot 221 in the sacrificial material 228, or the additional slot 225 in the sacrificial material 228 may exhibit one or more of different dimensions and a different shape than the slot 221 in the sacrificial material 228. The photoresist structure 227 may protect portions of the additional barrier material 226 within the third trench 223 from being removed (e.g., punched through) during subsequent processes, as described in further detail below. In addition, the photoresist structure 227 may exhibit any thickness (e.g., in the Z-direction) permitting desired patterning of other components of the electronic device structure 200 using photoresist structure 227, such as a thickness within a range of from about 1 nm to about 10,000 nm.

The photoresist structure 227 may be formed of and include a conventional photoresist material, such as a conventional positive tone photoresist material, or a conventional negative tone photoresist material. The properties (e.g., tone) of the photoresist structure 227 may be selected relative to material compositions of the materials and structures (e.g., sacrificial material 228, the additional barrier material 226, the dielectric structure 202) underlying the photoresist structure 227 to facilitate desired patterning of the materials and structures, as described in further detail below. Suitable photoresist materials (e.g., positive tone photoresist materials, negative tone photoresist materials) are known in the art, and are, therefore, not described in detail herein. The photoresist structure 227 may, for example, be compatible with 13.7 nm, 157 nm, 193 nm, 248 nm, or 365 nm wavelength systems; with 193 nm wavelength immersion systems; and/or with electron beam lithographic systems.

The photoresist structure 227 may be formed using conventional processes (e.g., conventional deposition processes, such as one or more PVD, CVD, ALD, and spin-coating; conventional photolithography processes; conventional material removal processes). Such processes are known in the art and, therefore, are not described in detail herein.

Figure 2B:
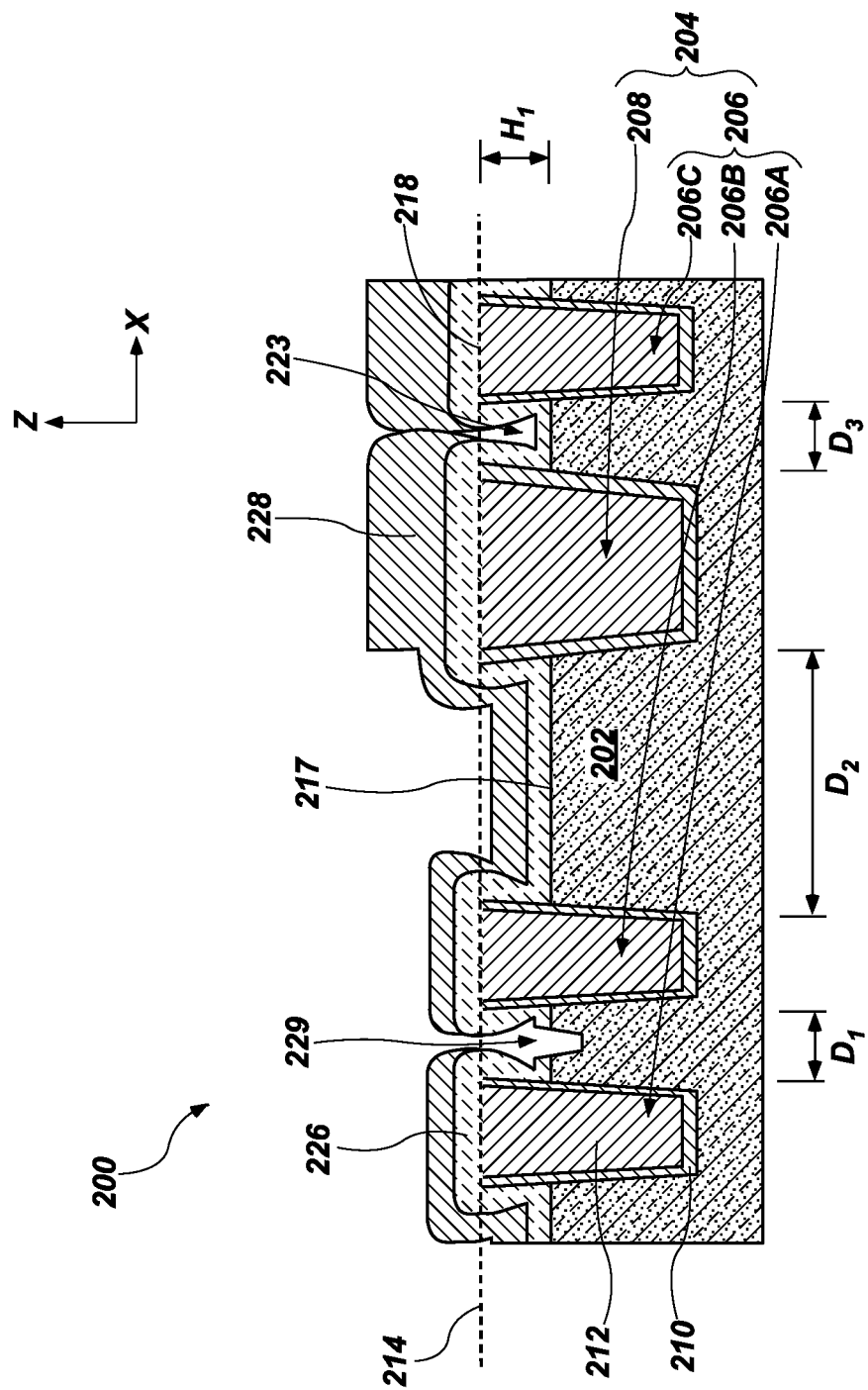

Referring next to FIG. 2B, the electronic device structure 200 may be subjected to at least one material removal process to remove portions of the additional barrier material 226 within the first trench 222 (FIG. 1D) and portions of the dielectric structure 202 vertically underlying the first trench 222 (FIG. 1D). As shown in FIG. 2B, the material removal process may form a preliminary trench 229 vertically-extending (e.g., in the Z-direction) into the dielectric structure 202 and lateral intervening (e.g., in the X-direction) between the first narrower interconnect structure 206A and the second narrower interconnect structure 206B. During the material removal process, the photoresist structure 227 (FIG. 2A) may protect the additional portions of the additional barrier material 226 within the third trench 223 from being removed, to substantially maintain the third trench 223 and the additional portions of the additional barrier material 226 therein. As depicted in FIG. 2B, the material removal process may reduce thicknesses of portions of the sacrificial material 228 not covered by the photoresist structure 227 (FIG. 2A), while thicknesses of additional portions of the sacrificial material 228 covered by the photoresist structure 227 (FIG. 2A) during the material removal process may be substantially maintained. The material removal process may also at least partially (e.g., substantially) remove the photoresist structure 227 (FIG. 2A).

One or more conventional material removal processes may be employed to remove portions of the additional barrier material 226 within the first trench 222 (FIG. 2A), portions of the dielectric structure 202 vertically under the first trench 222 (FIG. 2A), portions of the sacrificial material 228 not covered by the photoresist structure 227 (FIG. 2A), and at least a portion of the photoresist structure 227 (FIG. 2A). By way of non-limiting example, the electronic device structure 200 at the processing stage depicted in FIG. 2A may be subjected to at least one anisotropic dry etching process (e.g., one or more of RIE, deep RIE, plasma etching, reactive ion beam etching, and chemically assisted ion beam etching to remove portions of the additional barrier material 226 within the first trench 222 (FIG. 2A)), portions of the dielectric structure 202 vertically under the first trench 222 (FIG. 2A), portions of the sacrificial material 228 not covered by the photoresist structure 227 (FIG. 2A), and at least a portion of the photoresist structure 227 (FIG. 2A). In some embodiments, the electronic device structure 200 is subjected to at least one RIE process to form the preliminary trench 229 in the dielectric structure 202, thin portions of the sacrificial material 228 not covered by the photoresist structure (FIG. 2A), and at least partially remove the photoresist structure 227 (FIG. 2A).

Figure 2C:
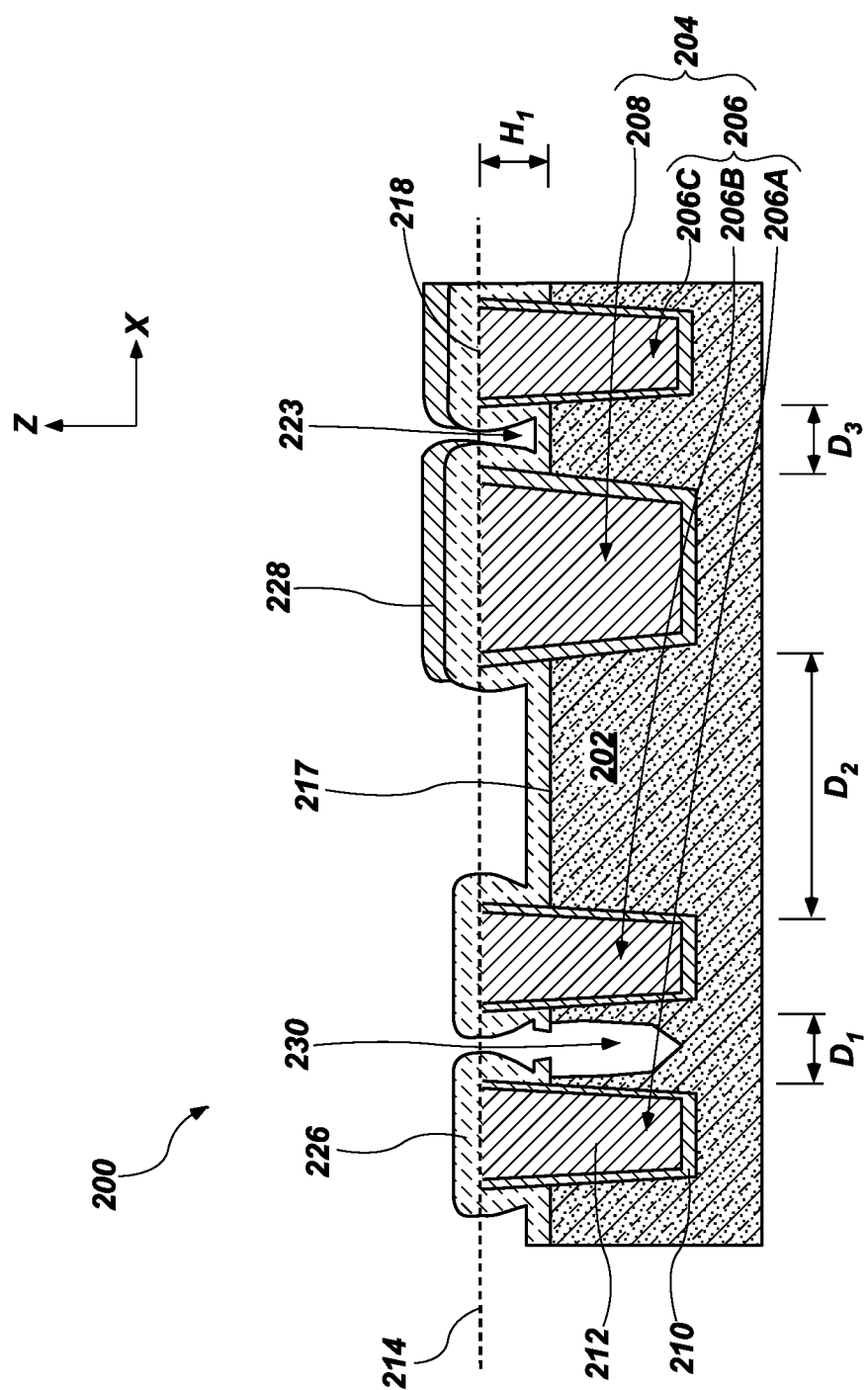

Referring next to FIG. 2C, the electronic device structure 200 at the processing stage depicted in FIG. 2B may be subjected to at least one additional material removal process to enlarge (e.g., vertically expand, horizontally expand) the preliminary trench 229 (FIG. 2B) and form the additional trench 230. The additional material removal process may remove additional portions of the dielectric structure 202 exposed through the preliminary trench 229 (FIG. 2B), and may also remove additional portions of the sacrificial material 228. The additional barrier material 226 may not be substantially removed during the additional material removal process. Accordingly, as shown in FIG. 2C, the configuration of the third trench 223 may be substantially maintained (e.g., may remain substantially unchanged) following the additional material removal process. Portions of the additional barrier material 226 may still substantially cover (e.g., line) surfaces of the dielectric structure 202 and the interconnect structures 204 (e.g., the wider interconnect structure 208 and the third narrower interconnect structure 206C) at least partially defining the third trench 223, and portions of the dielectric structure 202 vertically underlying the third trench 223 may remain substantially unremoved.

As shown in FIG. 2C, the additional material removal process may also remove portions of the sacrificial material 228 to reduce thicknesses of sacrificial material 228. By way of non-limiting example, portions of the sacrificial material 228 not previously covered by the photoresist structure 227 (FIG. 2A) may be substantially removed, and additional portions of sacrificial material 228 previously covered by the photoresist structure 227 (FIG. 2A) may remain but may exhibit reduced thicknesses relative to the as-formed thicknesses thereof. In additional embodiments, portions of the sacrificial material 228 not previously covered by the photoresist structure 227 (FIG. 2A) remain but exhibit reduced thicknesses relative to the as-formed thicknesses thereof, and additional portions of sacrificial material 228 previously covered by the photoresist structure 227 (FIG. 2A) also remain but also exhibit relative to the as-formed thicknesses thereof. In further embodiments, portions of the sacrificial material 228 not previously covered by the photoresist structure 227 (FIG. 2A) are substantially removed, and additional portions of sacrificial material 228 previously covered by the photoresist structure 227 (FIG. 2A) are also substantially removed. Remaining portions of the sacrificial material 228 (if any) following the additional material removal process may, for example, exhibit one or more thicknesses less than or equal to about 50 nm, such as within a range of from about 0.1 nm to about 50 nm.

One or more conventional material removal processes (e.g., one or more conventional dry etching processes, one or more conventional wet etching processes) may be employed to form the additional trench 230. In some embodiments, a combination of dry etching and wet etching is employed to form the additional trench 230 and remove at least some portions of the sacrificial material 228. For example, at least one anisotropic dry etching process (e.g., one or more of RIE, deep RIE, plasma etching, reactive ion beam etching, and chemically assisted ion beam etching) may be used to remove additional portions of the dielectric structure 202 exposed within the preliminary trench 229 (FIG. 2B) and portions of the sacrificial material 228; and then at least one wet etching process (e.g., an etching process employing at least one wet etchant, such as one or more HF, BOE, and HNO$_3$) may be used to remove additional portions of the dielectric structure 102 exposed within the enlarged preliminary trench to form the additional trench 230, as well as additional portions of the sacrificial material 228. In further embodiments, the electronic device structure 200 at the processing stage depicted in FIG. 2B is subjected to a single (e.g., only one) etching process, such as only one wet etching process or only one dry etching process to form the additional trench 230 and remove at least some portions of the sacrificial material 228.

Figure 2D:
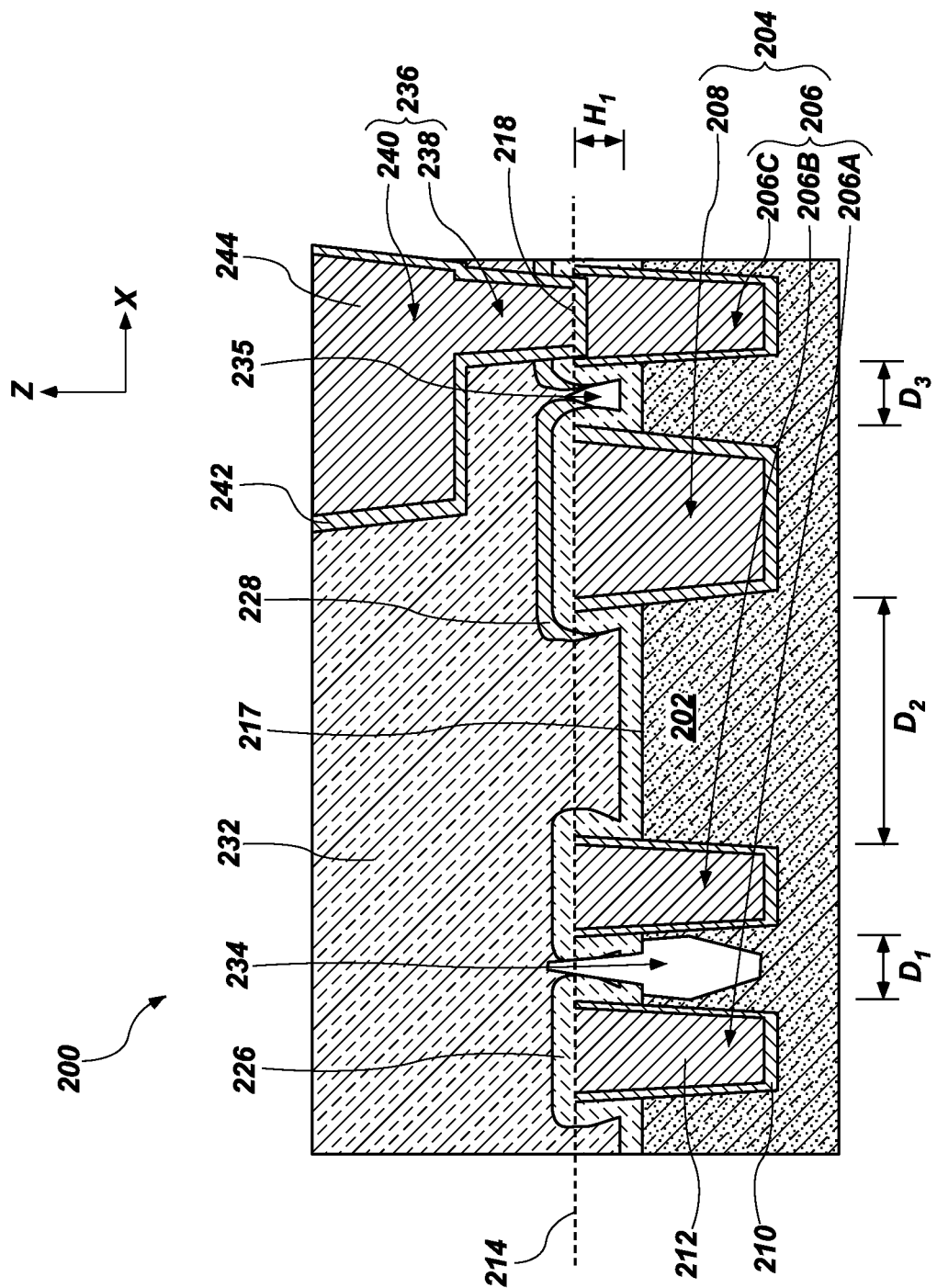

Referring next to FIG. 2D, an isolation material 232 (e.g., an ILD material) may be formed (e.g., non-conformally formed) over exposed surfaces of the electronic device structure 200, and one or more additional interconnect structures 236 may be formed to extend through the isolation material 232, remaining portions (if any) of the sacrificial material 228, and remaining portions of the additional barrier material 226 to one or more of the interconnect structures 204. As shown in FIG. 2D, the isolation material 232 may be formed on or over surfaces (e.g., upper surfaces, outer side surfaces) of one or more of the sacrificial material 228 and the additional barrier material 226 outside of the additional trench 230 (FIG. 2C) and the third trench 223 (FIG. 2C) without substantially filling the additional trench 230 (FIG. 2C) and the third trench 223 (FIG. 2C) with the isolation material 232 below upper vertical boundaries (e.g., the upper surfaces 218) of the interconnect structures 204. Accordingly, an air gap 234 corresponding to a portion of the additional trench 230 (FIG. 2C) remaining unfilled with the isolation material 232 may laterally intervene between the first narrower interconnect structure 206A and the second narrower interconnect structure 206B following the formation of the isolation material 232; and an additional air gap 235 corresponding to a portion of the third trench 223 (FIG. 2C) remaining unfilled with the isolation material 232 may laterally intervene between the wider interconnect structure 208 and the third narrower interconnect structure 206C following the formation of the isolation material 232. The air gap 234 and the additional air gap 235 may serve as insulators having a dielectric constant (k) of about 1. The air gap 234 and the additional air gap 235 may limit capacitance (e.g., parasitic capacitance, stray capacitance) and increase shorts margin between laterally-neighboring interconnect structures 204, and may reduce cross-talk between laterally-neighboring interconnect structures 204.

The isolation material 232 may be formed of and include at least one dielectric material, such as one or more of at least one dielectric oxide material (e.g., one or more of SiO$_x$, phosphosilicate glass, borosilicate glass, borophosphosilicate glass, fluorosilicate glass, AlO$_x$, HfO$_x$, NbO$_x$, and TiO$_x$), at least one dielectric nitride material (e.g., SiN$_y$), at least one dielectric oxynitride material (e.g., SiO$_x$N$_y$), at least one dielectric oxycarbide material (e.g., SiO$_x$C$_z$), at least one dielectric carboxynitride material (e.g., SiO$_x$C$_z$N$_y$), and amorphous carbon. In some embodiments, the isolation material 232 comprises SiO$_2$.

The air gap 234 may vertically extend from a location vertically above, vertically at, or vertically below upper vertical boundaries of the interconnect structures 204 to an additional location vertically below, vertically at, or vertically above lower vertical boundaries of the interconnect structures 204. As shown in FIG. 2D, in some embodiments, the air gap 234 vertically extends from a location vertically above upper vertical boundaries of the interconnect structures 204 (e.g., vertically above the plane 214 shared by the upper surfaces 218 of the interconnect structures 204) to an additional location vertically below the recessed upper surfaces 217 of the dielectric structure 102 but vertically above lower vertical boundaries of the interconnect structures 204. The air gap 234 may, for example, vertically extend from a location vertically at or vertically above uppermost boundaries of the additional barrier material 226 to an additional location vertically at or substantially vertically proximate lower vertical boundaries of the conductive material 212 of the interconnect structures 204. In additional embodiments, the air gap 234 may vertically extend from a different location (e.g., a location vertically at or vertically below upper vertical boundaries of the interconnect structures 204) and/or may vertically terminate at a different additional location (e.g., an additional location vertically above the lower boundaries of the interconnect structures 204, an additional location vertically at the lower boundaries of the interconnect structures 204, an additional location vertically below the lower boundaries of the interconnect structures 204). As shown in FIG. 2D, the additional barrier material 226 may laterally intervene (e.g., in the X-direction) between an upper portion of the air gap 234 (e.g., a portion of the air gap 234 vertically above the recessed upper surfaces 217 of the dielectric structure 202) and upper portions of the interconnect structures 204 (e.g., the first narrower interconnect structure 206A and the second narrower interconnect structure 206B) laterally-neighboring the air gap 234, but the additional barrier material 226 may not laterally intervene (e.g., in the X-direction) between a lower portion of the air gap 234 (e.g., a portion of the air gap 234 vertically extending into the dielectric structure 202) and lower portions of the interconnect structures 204 laterally-neighboring the air gap 234.

The additional air gap 235 may vertically extend from a location vertically above, vertically at, or vertically below the upper vertical boundaries of the interconnect structures 204 to an additional location vertically above the lower vertical boundaries of the interconnect structures 204. As shown in FIG. 2D, in some embodiments, the additional air gap 235 vertically extends from a location vertically above upper vertical boundaries of the interconnect structures 204 (e.g., vertically above the plane 214 shared by the upper surfaces 218 of the interconnect structures 204) to an additional location vertically above the recessed upper surfaces 217 of the dielectric structure 102. The additional air gap 235 may, for example, vertically extend from a location vertically at or vertically above the upper surfaces 218 of the interconnect structures 204 to an additional location vertically at or substantially vertically proximate an upper surface of the additional barrier material 226. In additional embodiments, the additional air gap 235 vertically extends from a different location (e.g., a location vertically below upper vertical boundaries of the interconnect structures 204). As shown in FIG. 2D, the additional barrier material 226 may laterally intervene (e.g., in the X-direction) between the additional air gap 235 and upper portions of the interconnect structures 204 (e.g., the wider interconnect structure 208 and the third narrower interconnect structure 206C) laterally-neighboring the additional air gap 235, and may vertically intervene (e.g., in the Z-direction) between the additional air gap 235 and the dielectric structure 202.

With continued reference to FIG. 2D, the additional interconnect structure 236 may include a narrower lower portion 238 (e.g., a via portion) in contact (e.g., in electrical contact, in physical contact) with one or more of the interconnect structures 204 (e.g., the third narrower interconnect structure 206C), and a wider upper portion 240 (e.g., a line portion, a routing portion) over the lower portion 238. The narrower lower portion 238 of the additional interconnect structure 236 may be integral and continuous with the wider upper portion 240 of the additional interconnect structure 236. As shown in FIG. 2D, in some embodiments, the wider upper portion 240 of the additional interconnect structure 236 vertically extends from an upper boundary (e.g., an upper surface) of the isolation material 232 and through an upper portion of the isolation material 232; and the narrower lower portion 238 extends from a lower boundary of the wider upper portion 240, through a lower portion of isolation material 232 and portions of the sacrificial material 228 and the additional barrier material 226 overlying the third narrower interconnect structure 206C, and to the upper surface 218 of the third narrower interconnect structure 206C.

The additional interconnect structure 236 may include at least one further barrier material 242 on or over surfaces of the isolation material 232, the sacrificial material 228 (if any), the additional barrier material 226, and the conductive material 212 of at least one of the interconnect structures 204 (e.g., the third narrower interconnect structure 206C), and at least one additional conductive material 244 on or over surfaces of the further barrier material 242. For example, as shown in FIG. 2D, the additional interconnect structure 236 may include the further barrier material 242 on surfaces of the isolation material 232, the sacrificial material 228, the additional barrier material 226, and the conductive material 212 of the third narrower interconnect structure 206C defining boundaries (e.g., vertical boundaries, horizontal boundaries) of the additional interconnect structure 236; and the additional conductive material 244 on surfaces of the further barrier material 242. The further barrier material 242 may intervene (e.g., horizontally intervene, vertically intervene) between the additional conductive material 244 and each of the isolation material 232, the sacrificial material 228 (if any), the additional barrier material 226, and the conductive material 212 of at least one of the interconnect structures 204.

The further barrier material 242 may be formed of and include at least one material that impedes (e.g., substantially prevents) diffusion of elements of the additional conductive material 244 into other structures and/or materials. The further barrier material 242 may also impede (e.g., substantially prevent) the formation of silicide materials from elements of the additional conductive material 244 and at least the isolation material 232 that may otherwise effectuate electrical shorts. In some embodiments, such as embodiments wherein the additional conductive material 244 comprises Cu, the further barrier material 242 comprises one or more of a tantalum-containing material, a tungsten-containing material, a titanium-containing material, and a ruthenium-containing material. For example, the further barrier material 242 may be formed of and include one or more of elemental Ta, $TaN_y$, elemental W, $WN_y$, elemental Ti, and $TiN_y$. A material composition of the further barrier material 242 may be substantially the same as a material composition of the barrier material 110, or a material composition of the further barrier material 242 may be different than a material composition of the barrier material 110. In some embodiments, the further barrier material 242 is $TaN_y$. The further barrier material 242 may have any thickness able to substantially prevent diffusion of elements of the additional conductive material 244 into other structures and/or materials adjacent the further barrier material 242. By way of non-limiting example, the further barrier material 242 may have a thickness less than or equal to about 100 nm, such as within a range of from about 10 nm to about 100 nm (e.g., within a range of from about 10 nm to about 50 nm, within a range of from about 20 nm to about 50 nm, or within a range of from about 20 nm to about 40 nm).

The additional conductive material 244 may be formed of and include at least one metal material, such as one or more of a Cu-containing material and an Al-containing material. For example, the additional conductive material 244 may be formed of and include one or more of elemental Cu, a Cu-containing alloy, elemental Al, and an Al-containing alloy. A material composition of the further additional conductive material 244 may be substantially the same as a material composition of the conductive material 112, or a material composition of the additional conductive material 244 may be different than a material composition of the conductive material 112. In some embodiments, the additional conductive material 244 is elemental Cu. The additional conductive material 244 may be substantially free of void spaces (e.g., air gaps) therein.

The isolation material 232 and the additional interconnect structure 236 may be formed using conventional processes (e.g., conventional deposition processes, conventional photolithography processes, conventional material removal processes) and conventional processing equipment, which are not described in detail herein. For example, the isolation material 232 may be formed on or over portions of the exposed surfaces of the electronic device structure 200 using one or more conventional non-conformal deposition processes (e.g., at least one conventional non-conformal PVD process). Thereafter, at least one trench having the dimensions and peripheral shape of the additional interconnect structure 236 may be formed in the isolation material 232, the sacrificial material 228 (if any), the additional barrier material 226 using one or more conventional photolithography processes (e.g., conventional photoresist deposition, photoexposure, and development processes) and one or more conventional etching processes (e.g., conventional anisotropic dry etching processes). The further barrier material 242 may then be conformally deposited (e.g., through one or more of an ALD process and a conformal CVD process) on exposed surfaces of the electronic device structure 200 inside and outside of the trench, a conductive seed material (e.g., one or more of elemental Cu and a Cu alloy, such as a CuMn alloy) may be deposited (e.g., through a PVD process) on surfaces of the further barrier material 242 inside and outside of the trench, and then the additional conductive material 244 (e.g., elemental Cu) may be formed (e.g., electroplated, electrolessly plated) on or over the conductive seed material to fill (e.g., substantially fill) a remaining portion of the trench. Subsequently, at least portions of the further barrier material 242 and the additional conductive material 244 outside of the trench may be removed (e.g., through at least one CMP process) to form the additional interconnect structure 236.

Figure 3:
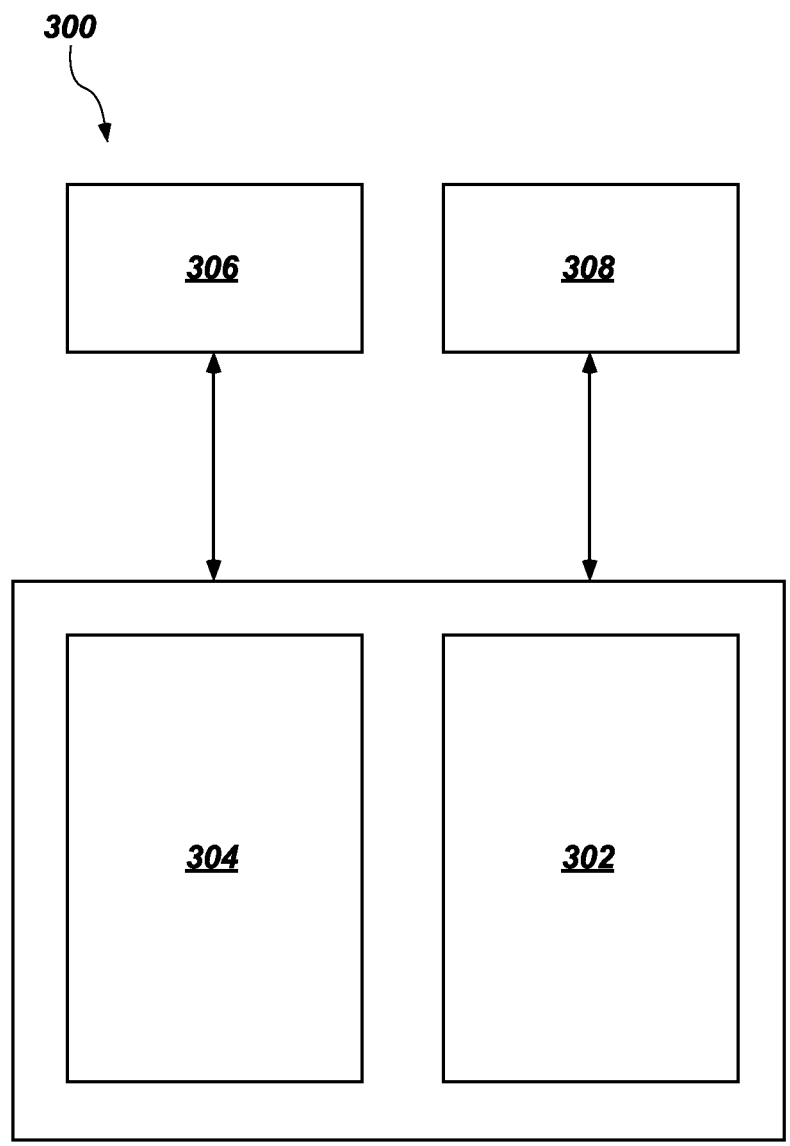
FIG. 3 is a schematic block diagram of an electronic system, in accordance with an embodiment of the disclosure.

Electronic device structures (e.g., the electronic device structures 100, 200) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of the electronic device structures (e.g., electronic device structures 100, 200) previously described herein. The electronic system 300 may further include at least one electronic signal processor device 304 (often referred to as a "microprocessor"). The electronic signal processor device 304 may, optionally, include an embodiment of one or more of the electronic device structures (e.g., the electronic device structures 100, 200) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises a structure comprising interconnect structures vertically extending into a dielectric structure and having upper surfaces vertically offset from upper surfaces of the dielectric structure, a low-k dielectric material on surfaces of the interconnect structures above the upper surfaces of the dielectric structure, a dielectric material overlying the low-k dielectric material, and air gaps laterally intervening between at least some of the interconnect structures. The interconnect structures each comprise a barrier material on surfaces of the dielectric structure and comprising one or more of a tantalum-containing material, a tungsten-containing material, a titanium-containing material, and a ruthenium-containing material; and a conductive, copper-containing material on surfaces of the barrier material. The air gaps vertically extend from locations within the dielectric material, through the low-k dielectric material, and to other locations within the dielectric structure.

The methods of the disclosure may facilitate the formation of electronic devices (e.g., semiconductor devices, memory devices) and systems (e.g., electronic systems) having one or more of increased performance, increased efficiency, increased reliability, and increased durability as compared to conventional electronic devices (e.g., conventional semiconductor devices, conventional memory devices) and conventional systems (e.g., conventional electronic systems). For example, the methods of the disclosure may facilitate the formation of air gaps (e.g., the air gaps 134, 234 shown in FIGS. 1F and 2D, respectively) between laterally-neighboring interconnect structures (e.g., the interconnect structures 104, 204 shown in FIGS. 1F and 2D, respectively) to effectuate a reduction in undesirable capacitive coupling, while also protecting electrically conductive features (e.g., the conductive materials 112, 212 of the interconnect structures 104, 204 shown in FIGS. 1F and 2D, respectively) from being undesirably etched during the formation of the air gaps so as to preserve the integrity of both the electrically conductive features and the air gaps. The air gaps formed through the methods of the disclosure may have relatively reduced amounts of relatively higher dielectric constant materials (e.g., materials having a dielectric constant greater than air and less than or equal to that of $Si_3N_4$, such as BLOK materials) laterally intervening between the air gaps and laterally-neighboring interconnect structures, which may increase the efficiency of the air gaps and further reduce capacitive coupling between laterally-neighboring interconnect structures as compared to conventional configurations including greater amounts of higher dielectric constant materials laterally intervening between air gaps and laterally-neighboring interconnect structures.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. An electronic device, comprising:
   a dielectric structure;
   interconnect structures extending into the dielectric structure and having uppermost vertical boundaries above uppermost vertical boundaries of the dielectric structure, each of the interconnect structures comprising:
      a conductive material; and
      a barrier material intervening between the conductive material and the dielectric structure;
   an additional barrier material covering surfaces of the interconnect structures above the uppermost vertical boundaries of the dielectric structure;
   an isolation material overlying the additional barrier material; and
   at least one air gap laterally intervening between at least two of the interconnect structures laterally-neighboring one another, the at least one air gap vertically extending from a lower portion of the isolation material, through the additional barrier material, and into the dielectric structure.

2. The electronic device of claim 1, wherein the uppermost vertical boundaries of the interconnect structures are offset from the uppermost vertical boundaries of the dielectric structure by a vertical distance within a range of from about 1.5 times a thickness of the additional barrier material to about 3.0 times the thickness of the additional barrier material.

3. The electronic device of claim 1, wherein:
   the conductive material of each of the interconnect structures comprises copper; and
   the barrier material of each of the interconnect structures comprises one or more of a tantalum-containing material, a tungsten-containing material, a titanium-containing material, and a ruthenium-containing material.

4. The electronic device of claim 1, wherein:
   the at least two of the interconnect structures are laterally separated from one another by a first distance; and
   at least two other of the interconnect structures are laterally separated from one another by a second distance greater than the first distance, the dielectric structure substantially free of air gaps laterally intervening between the at least two other of the interconnect structures.

5. The electronic device of claim 4, wherein:
the at least two of the interconnect structures comprise:
   a first interconnect structure; and
   a second interconnect structure having substantially the same width as the first interconnect structure; and
the at least two other of the interconnect structures comprise:
   the second interconnect structure; and
   a third interconnect structure having a larger width than the first interconnect structure and the second interconnect structure.

6. The electronic device of claim 1, wherein the additional barrier material comprises a low-k dielectric material having a lower a dielectric constant than $Si_3N_4$ and a thickness within a range of from about 30 nm to about 50 nm.

7. The electronic device of claim 1, wherein the dielectric structure and the isolation material each comprise $SiO_2$.

8. The electronic device of claim 1, wherein the at least one air gap vertically extends from a location proximate an uppermost vertical boundary of the additional barrier material to another location proximate lowermost vertical boundaries of the at least two of the interconnect structures.

9. The electronic device of claim 1, wherein the additional barrier material intervenes between the at least one air gap and upper portions of the at least two of the interconnect structures, but the additional barrier material does not intervene between the at least one air gap and lower portions of the at least two of the interconnect structures.

10. The electronic device of claim 1, further comprising at least one additional air gap laterally intervening between at least two other of the interconnect structures laterally-neighboring one another, the at least one additional air gap vertically extending from the lower portion of the isolation material and terminating at an upper surface of the additional barrier material.

11. The electronic device of claim 10, further comprising at least one additional interconnect structure vertically extending through the isolation material and the additional barrier material, the at least one additional interconnect structure at least partially vertically overlying the at least one additional air gap and in electrical communication with at least one of the interconnect structures.

12. The electronic device of claim 11, wherein the at least one additional interconnect structure comprises:
   a lower portion exhibiting a first width in physical contact with the at least one of the interconnect structures; and
   an upper portion integral and continuous with the lower portion and exhibiting a second width greater than the first width.

13. An electronic device, comprising:
a dielectric structure;
a first interconnect structure comprising a first portion and a second portion, the first portion embedded in the dielectric structure, and the second portion continuous with the first portion and protruding from the dielectric structure;
a second interconnect structure extending substantially parallel to the first interconnect structure and comprising a third portion and a fourth portion, the third portion embedded in the dielectric structure, and the fourth portion continuous with the third portion and protruding from the dielectric structure; and an air gap in the dielectric structure between the first portion of the first interconnect structure and the third portion of the second interconnect structure.

14. The electronic device of claim 13, wherein the air gap is elongated between the second portion of the first interconnect structure and the fourth portion of the second interconnect structure.

15. The electronic device of claim 14, further comprising interlayer dielectric material covering the first interconnect structure and the second interconnect structure without filling the air gap.

16. The electronic device of claim 13, further comprising a third interconnect structure comprising a fifth portion and a sixth portion, the fifth portion embedded in the dielectric structure, and the sixth portion continuous with the fifth portion and protruding from the dielectric structure, wherein a distance between the first interconnect structure and the second interconnect structure is less than a distance between the second interconnect structure and the third interconnect structure such that no air gap is in the dielectric structure between the third portion of the second interconnect structure and the fifth portion of the third interconnect structure.

17. A method of forming an electronic device, comprising:
   forming interconnect structures vertically extending into a dielectric structure, the interconnect structures each comprising a conductive material and a barrier material intervening between the conductive material and the dielectric structure;
   recessing the dielectric structure relative to the interconnect structures to form trenches between upper portions of the interconnect structures;
   conformally forming an additional barrier material over surfaces of the interconnect structures and the dielectric structure inside and outside of the trenches;
   forming a sacrificial material over the additional barrier material such that at least one of the trenches remains substantially free of the sacrificial material therein, the sacrificial material exhibiting a slot vertically extending therethrough to a remaining portion of the at least one of the trenches;
   selectively removing portions of the additional barrier material exposed within the at least one of the trenches and portions of dielectric structure thereunder to form at least one additional trench vertically extending into the dielectric structure and laterally neighboring at least two of the interconnect structures; and
   forming an isolation material over surfaces of the additional barrier material outside of the at least one additional trench to form at least one enclosed air gap between the at least two of the interconnect structures.

18. The method of claim 17, wherein forming interconnect structures comprises forming the at least two of the interconnect structures to be laterally separated from one another by a first distance less than a second distance between at least two other of the interconnect structures laterally-neighboring one another.

19. The method of claim 18, wherein recessing the dielectric structure relative to the interconnect structures to form trenches between upper portions of the interconnect structures comprises:
   forming the at least one of the trenches between the at least two of the interconnect structures; and
   forming at least one other of the trenches between the at least two other of the interconnect structures, the at least one other of the trenches having a greater width than the at least one of the trenches.

20. The method of claim 19, wherein forming a sacrificial material over the additional barrier material comprises forming the sacrificial material to substantially fill the at least one other of the trenches but not the at least one of the trenches.

21. The method of claim 17, wherein recessing the dielectric structure relative to the interconnect structures comprises selectively removing upper portions of the dielectric structure to vertically recess upper surfaces of the dielectric structure from upper surfaces of the interconnect structures by a distance within a range of from about 1.5 times to about 3.0 times a thickness of the additional barrier material.

22. The method of claim 17, further comprising:
selecting the conductive material to comprise elemental Cu;
selecting the barrier material to comprise $TaN_y$; and
selecting the additional barrier material to comprise $SiC_yN_z$.

23. The method of claim 17, wherein selectively removing portions of the additional barrier material exposed within the at least one of the trenches and portions of dielectric structure thereunder comprises:
selectively removing the portions of the additional barrier material and a first amount of dielectric structure thereunder through an anisotropic dry etching process to form at least one preliminary trench vertically extending into the dielectric structure; and
selectively removing a second amount of dielectric structure through a wet etching process to enlarge the at least one preliminary trench and form the at least one additional trench.

24. The method of claim 17, wherein forming an isolation material over surfaces of the additional barrier material outside of the at least one additional trench comprises forming a dielectric material over the surfaces of the additional barrier material, the dielectric material closing off the at least one additional trench while vertically terminating within the at least one additional trench at a location above uppermost vertical boundaries of the interconnect structures.

25. The method of claim 17, wherein forming a sacrificial material over the additional barrier material further comprises forming the sacrificial material over the additional barrier material such that at least one other of the trenches remains substantially free of the sacrificial material therein, the sacrificial material exhibiting another slot vertically extending therethrough to a remaining portion of the at least one other of the trenches.

26. The method of claim 25, further comprising forming a photoresist structure over a portion of the sacrificial material to cover the another slot vertically extending through the sacrificial material.

27. The method of claim 26, wherein:
selectively removing portions of the additional barrier material exposed within the at least one of the trenches and portions of dielectric structure thereunder comprises removing the portions of the additional barrier material without removing additional portions of the additional barrier material within the at least one other of the trenches; and
forming an isolation material over surfaces of the additional barrier material outside of the at least one additional trench further comprises forming the isolation material over additional surfaces of the additional barrier material outside of the at least one other of the trenches to form at least one additional enclosed air gap between at least two other of the interconnect structures, the at least one additional enclosed air gap having a smaller volume than the at least one enclosed air gap.

28. The method of claim 27, wherein further comprising forming at least one additional interconnect structure vertically extending through the isolation material and the additional barrier material, the at least one additional interconnect structure at least partially vertically overlying the at least one additional enclosed air gap and in electrical contact with one of the at least two other of the interconnect structures.

29. An electronic system, comprising:
an input device;
an output device;
a processor device operably coupled to the input device and the output device; and
a memory device operably coupled to the processor device and comprising a structure comprising:
  interconnect structures vertically extending into a dielectric structure and having upper surfaces vertically offset from upper surfaces of the dielectric structure, the interconnect structures each comprising:
    a barrier material on surfaces of the dielectric structure and comprising one or more of a tantalum-containing material, a tungsten-containing material, a titanium-containing material, and a ruthenium-containing material; and
    a conductive, copper-containing material on surfaces of the barrier material; and
  a low-k dielectric material on surfaces of the interconnect structures above the upper surfaces of the dielectric structure;
  a dielectric material overlying the low-k dielectric material; and
  air gaps laterally intervening between at least some of the interconnect structures, the air gaps vertically extending from locations within the dielectric material, through the low-k dielectric material, and to other locations within the dielectric structure.

* * * * *

UNITED STATES PATENT AND TRADEMARK OFFICE
CERTIFICATE OF CORRECTION

PATENT NO. : 11,069,561 B2  
APPLICATION NO. : 16/409176  
DATED : July 20, 2021  
INVENTOR(S) : Toyonori Eto and Kuo-Chen Wang Page 1 of 1

It is certified that error appears in the above-identified patent and that said Letters Patent is hereby corrected as shown below:

In the Specification

| | | |
|---|---|---|
| Column 1, | Line 32, | change "capacitive coupling, between" to --capacitive coupling between-- |
| Column 16, | Line 37, | change "third trench 224," to --third trench 223,-- |

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*